United States Patent
Lee et al.

(10) Patent No.: US 12,086,526 B2
(45) Date of Patent: Sep. 10, 2024

(54) METHODS AND DEVICES OF CORRECTING LAYOUT FOR SEMICONDUCTOR PROCESSES USING MACHINE LEARNING

(71) Applicant: SAMSUNG ELECTRONICS CO., LTD., Suwon-si (KR)

(72) Inventors: Sooyong Lee, Yongin-si (KR); Jeeyong Lee, Anyang-si (KR); Seunghune Yang, Seoul (KR); Hyeyoung Ji, Hwaseong-si (KR)

(73) Assignee: SAMSUNG ELECTRONICS CO., LTD., Yongin-si (KR)

( * ) Notice: Subject to any disclaimer, the term of this patent is extended or adjusted under 35 U.S.C. 154(b) by 423 days.

(21) Appl. No.: 17/380,200

(22) Filed: Jul. 20, 2021

(65) Prior Publication Data
US 2022/0171913 A1 Jun. 2, 2022

(30) Foreign Application Priority Data
Dec. 2, 2020 (KR) .................. 10-2020-0166853

(51) Int. Cl.
*G06F 30/398* (2020.01)
*G06N 20/00* (2019.01)

(52) U.S. Cl.
CPC .......... *G06F 30/398* (2020.01); *G06N 20/00* (2019.01)

(58) Field of Classification Search
USPC ...................................................... 716/112
See application file for complete search history.

(56) References Cited

U.S. PATENT DOCUMENTS

| 10,282,509 B2 | 5/2019 | Watanabe et al. |
| 10,656,517 B2 | 5/2020 | Word et al. |
| 10,691,016 B2 | 6/2020 | Shim |
| 10,691,864 B2 | 6/2020 | Wang et al. |
| 10,706,205 B2 | 7/2020 | Shao et al. |
| 10,725,454 B2 | 7/2020 | Bonam et al. |
| 2005/0246674 A1* | 11/2005 | Scheffer .................. G06F 30/39 716/51 |
| 2020/0081352 A1 | 3/2020 | Kim |
| 2020/0133115 A1 | 4/2020 | Tien et al. |

* cited by examiner

*Primary Examiner* — Bryce M Aisaka
(74) *Attorney, Agent, or Firm* — F. CHAU & ASSOCIATES, LLC

(57) ABSTRACT

With respect to each layout pattern of a plurality of layout patterns included in a layout for semiconductor processes, where the layout includes schematic information to form process patterns of a semiconductor device, vertical features indicating an effect of a lower structure on the process patterns are determined, and the lower structure indicates a structure that is formed in the semiconductor device before the process patterns are formed. A machine learning module is trained based on a training layout and the vertical features of the training layout. A design layout with schematic information to form target process patterns is corrected based on the trained machine learning module, the design layout and the vertical features of the design layout. Reliability and integration of the layout for the semiconductor processes may be increased by correcting the layout based on the vertical features and the horizontal features.

18 Claims, 26 Drawing Sheets

FIG. 12

| ID | CDX | CDY | CDCX | CDCY | NUM6 | NUM10 | NUM15 | NUM20 | VT | SK | GS6 | GS10 | GS15 | GS20 | AR | VP | GP |
|---|---|---|---|---|---|---|---|---|---|---|---|---|---|---|---|---|---|
| 806246 | 1600 | 1600 | 33918816 | 38415318 | 0 | 5 | 8 | 14 | 7.47 | 6.08 | 0.92 | 3.44 | 7.36 | 11.11 | 2560000 | 1 | ON |
| 1034692 | 1900 | 1900 | 39040745 | 33281380 | 0 | 7 | 13 | 19 | 9.35 | 9.91 | 1.47 | 5.06 | 10.80 | 17.05 | 3610000 | 131 | ON |
| 665072 | 1650 | 1650 | 31654357 | 101210335 | 4 | 7 | 11 | 13 | 4.86 | 4.41 | 2.07 | 5.41 | 8.57 | 10.62 | 2722500 | 75 | ON |
| 894993 | 1650 | 1650 | 34604008 | 30585115 | 2 | 3 | 5 | 5 | 3.89 | 2.41 | 0.91 | 2.22 | 3.32 | 3.93 | 2722500 | 47 | ON |
| 3573066 | 1500 | 1500 | 70428169 | 48286937 | 2 | 5 | 9 | 16 | 2.18 | 5.91 | 1.50 | 4.45 | 9.25 | 14.78 | 2250000 | 0 | OX |

| IMAGE | GDSX | GDSY | MJAXCD | MNAXCD | AVCD |
|---|---|---|---|---|---|
| CHH_BIPU_0016339664.TIF | 3532057 | 5300233 | 114.05080 | 115.066 | 111.634431 |
| CHH_BIPU_0021964573.TIF | 289996 | 2955118 | 102.29810 | 138.670 | 114.821216 |
| CHH_BIPU_0015881816.TIF | 3510756 | 2254742 | 113.27150 | 115.486 | 112.090070 |
| CHH_BIPU_0014500302.TIF | 278589 | 940497 | 106.48510 | 116.186 | 110.877739 |
| CHH_BIPU_0014443459.TIF | 3571956 | 2206092 | 93.40625 | 122.528 | 106.933639 |
| CHH_BIPU_0015366712.TIF | 281889 | 132907 | 94.05908 | 121.534 | 106.917614 |

| | 400(x/y)[A.U] | 410(x1/y1)[A.U] | 420(x2/y2)[A.U] | 430(dx/dy)[A.U] |
|---|---|---|---|---|
| ITERATION 0 | 100/100 | 120/122 | 110/110 | 10/12 |
| ITERATION 1 | 90/98 | 108/109 | 110/110 | -2/-1 |
| ITERATION 2 | 92/89 | 110.2/110.3 | 110/110 | -0.2/-0.3 |
| ⋮ | | | | |
| ITERATION N | 92.2/89.4 | 110/110 | 92.2/89.4 | 0/0 |

METHODS AND DEVICES OF CORRECTING LAYOUT FOR SEMICONDUCTOR PROCESSES USING MACHINE LEARNING

CROSS-REFERENCE TO RELATED APPLICATION

This U.S. non-provisional application claims priority under 35 USC § 119 to Korean Patent Application No. 10-2020-0166853, filed on Dec. 2, 2020, in the Korean Intellectual Property Office (KIPO), the disclosure of which is incorporated by reference herein in its entirety.

TECHNICAL FIELD

The present disclosure generally relates to semiconductor integrated circuits, and more particularly to methods and devices of correcting a layout for semiconductor processes using machine learning.

DISCUSSION OF THE RELATED ART

Fabrication of semiconductors may involve a combination of various processes such as etching, deposition, plantation, growth, implanting, and the like. Etching may be performed by forming photoresist patterns on an object to be etched and then removing portions that are not covered by the photoresist patterns using chemical materials, gases, plasmas, ion beams, lasers, and/or other ablating means.

During the etching process, process deviations may occur due to various factors. The factors that cause the process deviations may be related to characteristics of processes and/or to characteristics of the semiconductor patterns formed by the photoresist patterns or the semiconductor pattern. The process deviations may be corrected by modifying or changing the layouts of the semiconductor patterns.

As the integration of semiconductor devices increases (i.e., as space on the semiconductor is utilized more efficiently) and the semiconductor process is miniaturized, the number of patterns included in a semiconductor layout may significantly increase. Accordingly, in the fabrication of these highly integrated devices, designing modifications to the layout of the semiconductor patterns to compensate for process deviations may become increasingly difficult.

SUMMARY

Some example embodiments may provide methods and devices capable of correcting a layout for semiconductor processes using machine learning, and capable of efficiently compensating for process deviations.

According to example embodiments, a method of correcting a layout for semiconductor processes includes receiving a layout, wherein the layout comprises schematic information for semiconductor processes to form process patterns of a semiconductor device, and further comprises a plurality of layout patterns; determining vertical features indicating an effect of a lower structure on the process patterns, where the lower structure indicates a structure that is formed in the semiconductor device before the process patterns are formed; training a machine learning module based on a training layout and the vertical features of the training layout; and correcting a design layout to form target process patterns based on the trained machine learning module, the design layout, and the vertical features of the design layout.

According to example embodiments, a method of providing input channels of a machine learning module to correct a layout for semiconductor processes includes, with respect to each layout pattern of layout patterns included in a layout to form process patterns of a semiconductor device, determining vertical features indicating an effect of a lower structure on the process patterns, where the lower structure indicates a structure that is formed in the semiconductor device before the process patterns are formed, and, with respect to each of the layout patterns, determining horizontal features indicating an effect of a disposition of the layout patterns on the process patterns, and generating input channels for training and inference of a machine learning module based on the horizontal features and the vertical features.

According to example embodiments, a computing device includes at least one processor, wherein the processor is capable of performing a method of correcting a layout for semiconductor processes. The method includes, with respect to each of layout patterns included in a layout for semiconductor processes to form process patterns of a semiconductor device, determining vertical features indicating an effect of a lower structure on the process patterns, where the lower structure indicating a structure that is formed in the semiconductor device before the process patterns are formed, training a machine learning module based on a training layout and the vertical features of the training layout, and correcting a design layout to form target process patterns based on the trained machine learning module, the design layout and the vertical features of the design layout.

According to example embodiments, a method of inference for a machine learning module may include: receiving a design layout including layout patterns for a semiconductor process, identifying vertical features of a lower structure of a semiconductor device, generating predicted process pattern data based on the vertical features and the design layout using a machine learning model, comparing the predicted process pattern data and target data for the semiconductor process to obtain comparison data, and updating the design layout based on the comparison data.

According to example embodiments, a method of training a machine learning module may include: receiving a training layout including layout patterns for a semiconductor process, identifying vertical features of a lower structure of a semiconductor device, generating predicted process pattern data based on the vertical features and the training layout using a machine learning model, comparing the predicted process pattern data and measured data to obtain comparison data, wherein the measured data is based on process patterns resulting from the training layout, and updating parameters of the machine learning model based on the comparison.

The method and the device of correcting the layout for the semiconductor processes according to example embodiments may increase reliability and integration of the layout for the semiconductor processes and reduce costs and time for designing the semiconductor device by correcting the layout using machine learning.

In addition, the method and the device of correcting the layout for the semiconductor processes according to example embodiments may further increase reliability and integration of the layout for the semiconductor processes by correcting the layout based on the vertical features in addition to the horizontal features.

BRIEF DESCRIPTION OF THE DRAWINGS

The above and other aspects and features of the present disclosure will become more apparent by describing in detail embodiments thereof with reference to the attached drawings, in which:

FIG. 12 is a diagram illustrating example input channels of a machine learning module in a method of correcting a layout for semiconductor processes according to example embodiments.

FIGS. 17A through 17C are diagrams illustrating example embodiments of an image conversion in a method of correcting a layout for semiconductor processes according to example embodiments.

DETAILED DESCRIPTION

Figure 1:
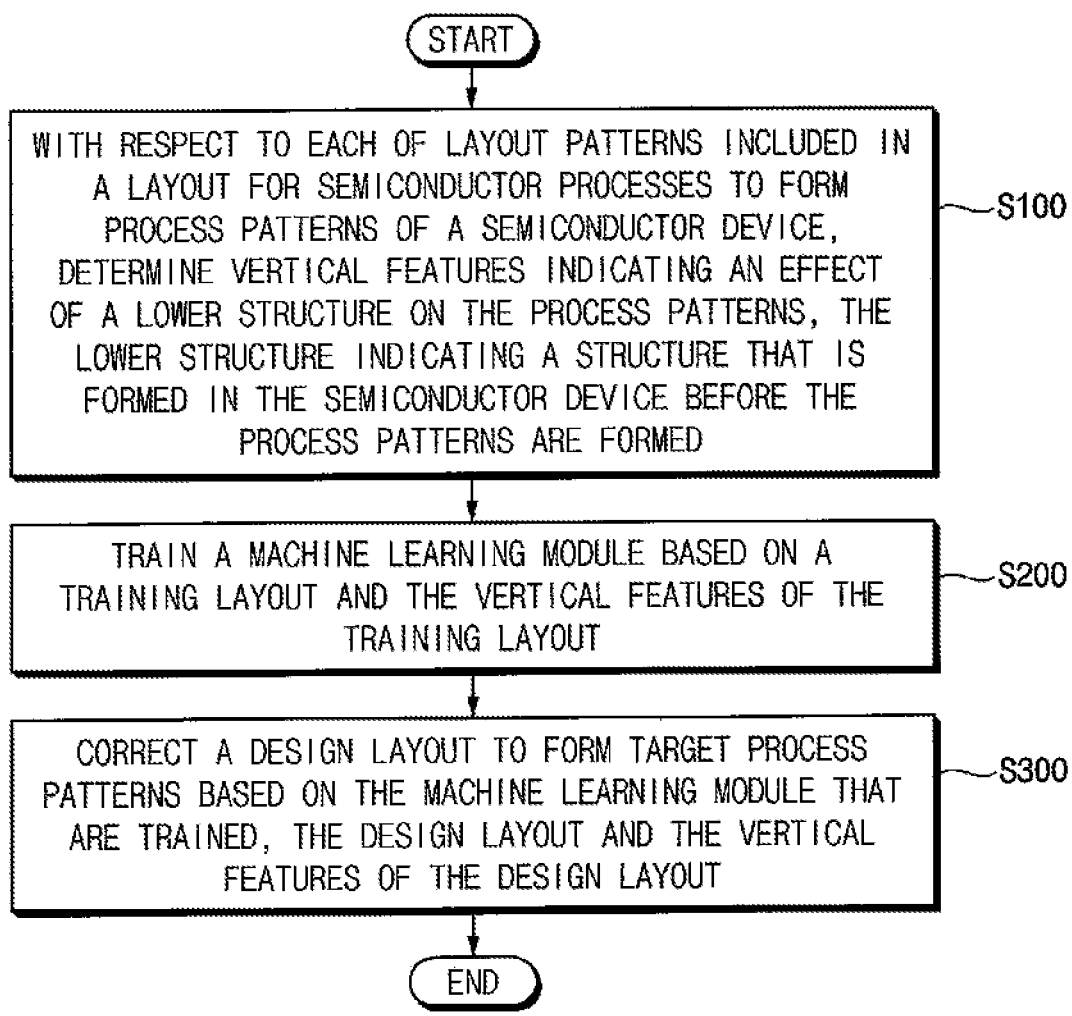
FIG. 1 is a flow chart of a method of correcting a layout for semiconductor processes according to example embodiments.

The present disclosure describes systems and methods for correcting a layout for semiconductor processes using machine learning. In conventional semiconductor fabrication processes, a designer may have to adjust portions of a circuit layout to increase space utilization, and prevent signal effects of circuits within close proximity. Further, a designer may not be able to accurately or fully account for the effects of circuits designed with a vertical (e.g., multi-layer) structure. Embodiments of the present disclosure use machine learning models and techniques to adjust and correct layouts involved in semiconductor processes, thereby saving time and cost.

Various example embodiments will be described more fully hereinafter with reference to the accompanying drawings, in which some example embodiments are shown. In the drawings, like numerals may refer to like elements throughout. To the extent that a description of an element has been omitted, it may be understood that the element is at least similar to corresponding elements that are described elsewhere in the specification.

FIG. 1 is a flow chart of a method of correcting a layout for semiconductor processes according to example embodiments.

Referring to FIG. 1, with respect to each layout pattern in a plurality of layout patterns included in a layout for the formation of process patterns of a semiconductor device, vertical features corresponding to effects of a lower structure on the process patterns may be determined, where the lower structure corresponds to a structure that is formed in the semiconductor device before the process patterns are formed (S100). The vertical features will be described below with reference to FIGS. 6 through 9.

A machine learning module may be trained based on a training layout and vertical features of the training layout (S200).

For training of the machine learning module, input channels of the machine learning module may be generated based on the vertical features of the layout patterns included in the training layout. Output data corresponding to process patterns that are expected to be formed by the training layout may be generated by processing the input channels through the machine learning module. The output data from the machine learning module may be compared with measured data that corresponds to patterns directly formed from the training layout. Parameters of the machine learning module may be changed based on the comparison between the output data and the measured data.

A design layout to form target process patterns may be corrected based on the trained machine learning module, the design layout, and the vertical features of the design layout (S300).

Input channels of the machine learning module may be generated from the vertical features of the layout patterns included in the design layout. Output data corresponding to process patterns that are expected to be formed by the design layout may be generated by processing the input channels through the machine learning module. The output data from the machine learning module may be compared with target data corresponding to the target process patterns. The target layout may be corrected based on the comparison between the output data and the target data.

As such, the method and the device of correcting the layout for the semiconductor processes according to example embodiments may increase reliability and integration of the layout for the semiconductor processes and reduce costs and time for designing the semiconductor device by correcting the layout using machine learning. For example, corrections in layout that may otherwise require human design choices and intervention may now be performed automatically and more quickly by the systems of the present disclosure, thereby reducing costs of a semiconductor device fabrication process.

In addition, the method and the device of correcting the layout for the semiconductor processes according to example embodiments may further increase reliability and integration of the layout for the semiconductor processes by correcting the layout based on vertical features corresponding to the effects circuit patterns disposed in different vertical layers have on each other, in addition to horizontal features of the layout.

Figure 2:
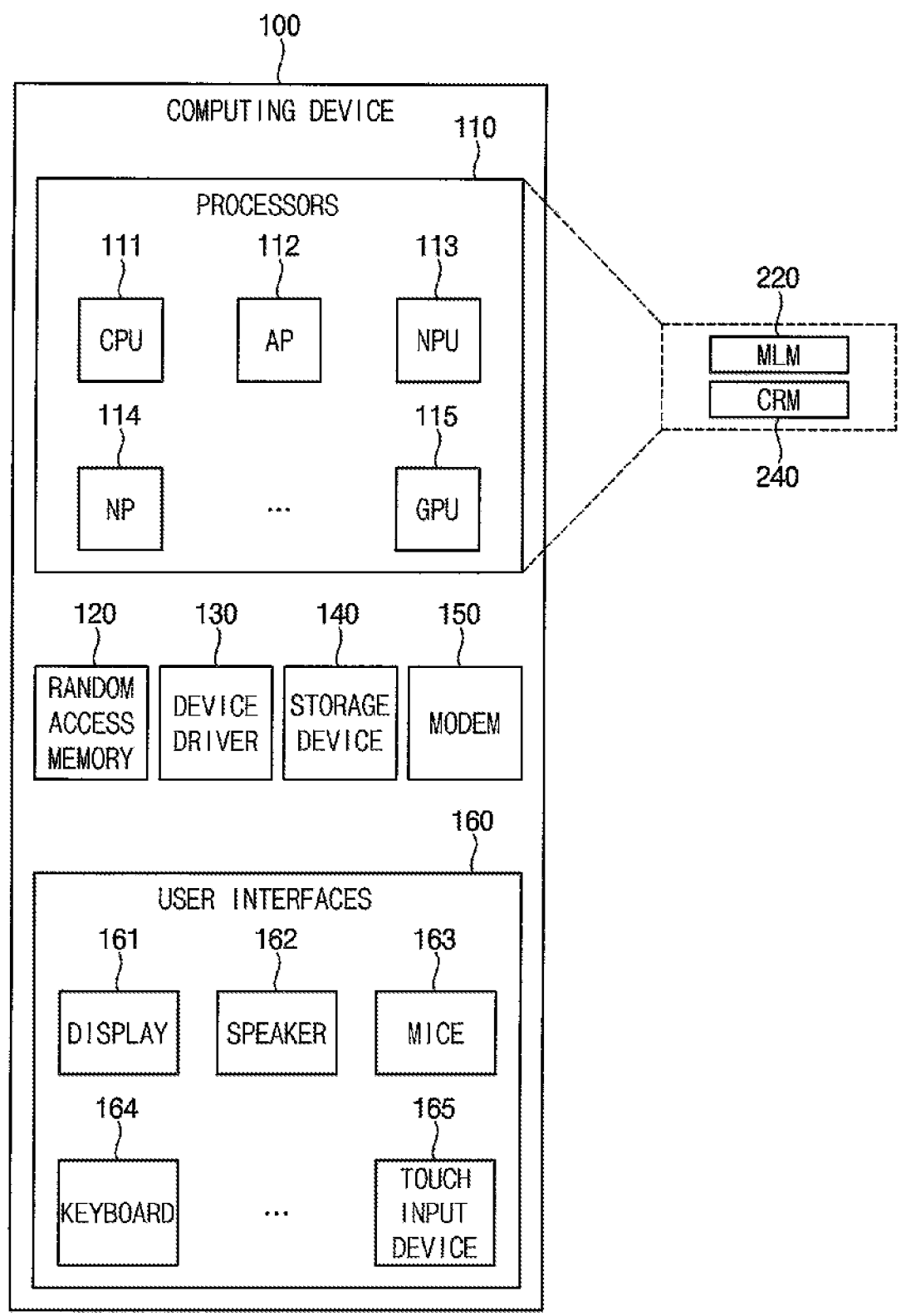
FIG. 2 is a block diagram illustrating a computing device according to example embodiments.

FIG. 2 is a block diagram illustrating a computing device according to example embodiments.

Referring to FIG. 2, a computing device 100 may include processors 110, a random access memory 120, a device driver 130, a storage device 140, a modem 150 and a user interface 160.

At least one processor of the processors 110 may be configured to operate a machine learning module MLM 220 and a correction module CRM 240. The machine learning module 220 and the correction module 240 may provide a layout used for manufacturing a semiconductor device.

In some example embodiments, the machine learning module 220 and the correction module 240 may be implemented as instructions or program codes that may be executed by the at least one of the processors 110. For example, the at least one processor may load the instructions to the random access memory 120.

In some example embodiments, the at least one processor may be manufactured to efficiently execute instructions included the machine learning module 220 and the correction module 240. For example, the at least one processor may efficiently execute instructions from various machine learning modules. In some embodiments, at least one processor may receive information corresponding to the machine learning module 220 and the correction module 240 to operate the machine learning module 220 and the correction module 240.

The processors 110 may include, for example, at least one general-purpose processor such as a central processing unit CPU 111, an application processor AP112, and/or other processing units. In addition, the processors 110 may include at least one special-purpose processor such as a neural processing unit NPU 113, a neuromorphic processor NP 114, a graphic processing unit GPU 115, etc. For example, the processors 110 may include two or more heterogeneous processors.

The random access memory 120 may be used as an operation memory of the processors 110, a main memory, and/or a system memory of the computing device 100. The random access memory 120 may include a volatile memory such as a dynamic random access memory (DRAM), a static random access memory (SRAM), or the like. Additionally or alternatively, the random access memory 120 may include a nonvolatile memory such as a phase-change random access memory (PRAM), a ferroelectrics random access memory (FRAM), a magnetic random access memory (MRAM), a resistive random access memory (RRAM), or the like.

The device driver 130 may control peripheral circuits such as the storage device 140, the modem 150, the user interface 160, etc., according to requests of the processors 110. The storage device 140 may include a fixed storage device such as a hard disk drive, a solid state drive (SSD), etc., or an attachable storage device such as an external hard disk drive, an external SSD, a memory card, and/or other external storage.

The modem 150 may perform wired or wireless communication with external devices through various communication methods such as Ethernet, WiFi, LTE, 5G mobile communication, and/or other communication methods.

The user interface 160 may receive information from a user and provide information to the user. The user interface 160 may include at least one output interface such as a display 161, a speaker 162, etc., and may further include at least one input interface such as mice (mouse) 163, a keyboard 164, and a touch input device 165.

In some embodiments, the machine learning module 220 and the correction module 240 may receive the instructions or codes through the modem 150 and store the instructions in the storage device 150. In some example embodiments, the instructions of the machine learning module 220 and the correction module 240 may be stored in an attachable storage device and the attachable storage device may be connected to the computing device 100 by a user. The instructions of the machine learning module 220 and the correction module 240 may be loaded in the random access memory 120 for rapid execution of the instructions.

Figure 3:
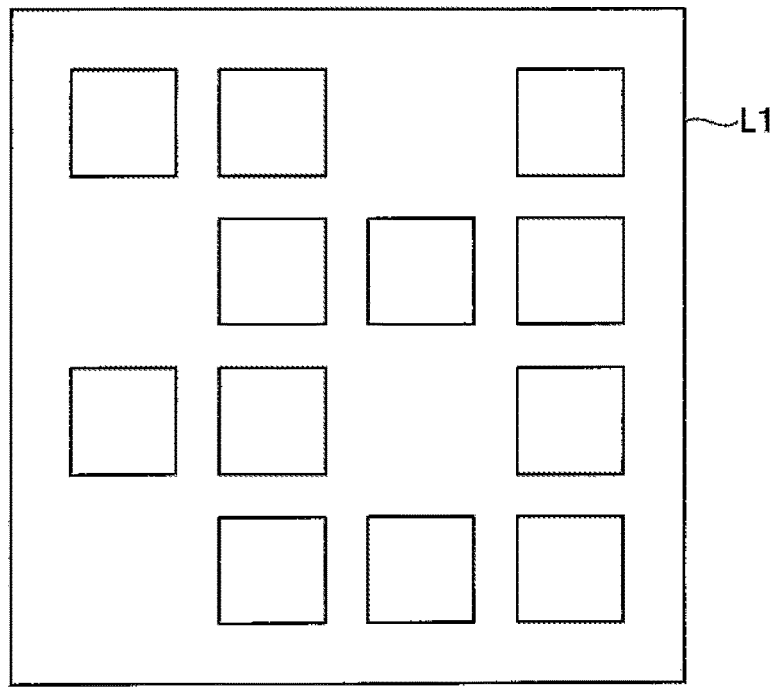
FIGS. 3 through 5 are diagrams illustrating an example of process proximity correction (PPC) and optical proximity correction (OPC) applicable to a method of correcting a layout for semiconductor processes according to example embodiments.
Figure 4:
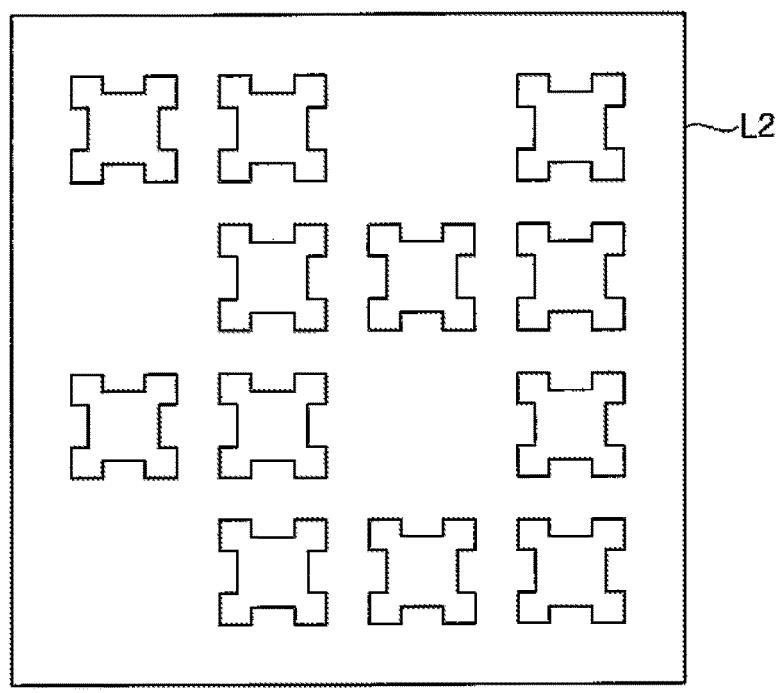
Figure 5:
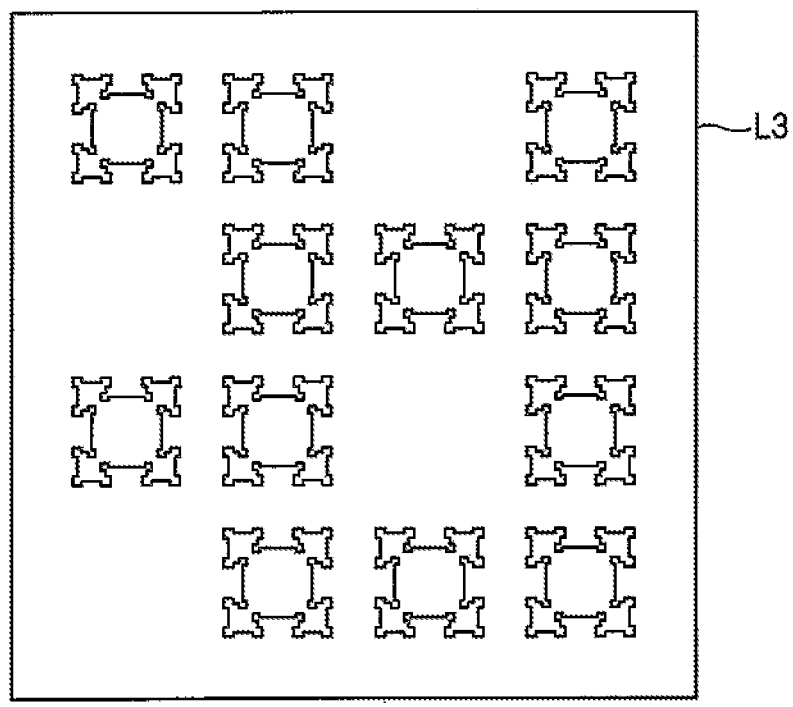

FIGS. 3 through 5 are diagrams illustrating an example of process proximity correction (PPC) and optical proximity correction (OPC) applicable to a method of correcting a layout for semiconductor processes according to example embodiments.

Referring to FIGS. 2 through 5, the machine learning module 220 may receive a first layout L1. For example, the first layout L1 may specify a target layout required to be obtained in after-cleaning inspection (ACI). The machine learning module 220 and the correction module 240 may perform the PPC with respect to the first layout L1 to generate a second layout L2. The PPC may be performed through inference based on machine learning with respect to features of patterns in the first layout L1. For example, the second layout L2 may be a target layout of photo resist patterns in after development inspection (ADI).

The PPC may compensate for distortion of the semiconductor patterns by effects from etching skew and/or effects of characteristics of the patterns during an etching process. For example, the PPC may expect portions of the patterns to be distorted and modify the expected distortions in advance to compensate for the distortion arising from physical semiconductor processes such as the etching process. As used herein, "physical processes" may refer to processes that are performed by mechanical equipment, rather than by hardware such as the computing device 100 or software such as the machine learning module 220 and the correction module 240.

The machine learning module 220 and the correction module 240 may perform the OPC with respect to the second layout L2 to generate a third layout L3. For example, the third layout L3 may be a layout of a photo-mask.

The OPC may compensate for distortion of the photo resist patterns by effects from etching skew and/or effects of characteristics of the patterns while the photoresist patterns are formed. For example, the PPC may expect portions of the patterns to be distorted and modify the expected distortions in advance to compensate for the distortion arising from physical semiconductor processes such as the etching process.

Semiconductor devices may be manufactured based on the third layout L3. For example, the photoresist patterns may be formed on an object (e.g., a semiconductor substrate) using the photo-mask of the third layout L3. Through the etching process, portions of the object that are not covered by the photoresist patterns may be removed. The remained photoresist patterns may then be removed and the semiconductor processes may be completed.

FIG. 3 shows an example of the first layout L1. For example, the first layout L1 may include rectangular patterns in which vias may be formed. The first layout L1 may specify a target layout required to be obtained in the ACI. For example, the first layout L1 may be a layout including process patterns formed by the semiconductor processes.

FIG. 4 shows an example of the second layout L2. The second layout L2 of FIG. 4 may include patterns that are modified from the patterns of the first layout L1. The second layout L2 may specify a target layout required to be obtained in the ADI. For example, the second layout L2 may be a layout including photo resist patterns.

While FIGS. 3 and 4 illustrate that the patterns are modified around a similar shape for convenience of illustration, the patterns may be modified to different shapes.

FIG. 5 shows an example of the third layout L3. The third layout L3 may include patterns that are modified from the patterns of the second layout L2. The third layout L3 may be a layout of a photo-mask.

While FIGS. 4 and 5 illustrate that the patterns are modified around a similar shape convenience of illustration, and the patterns may be modified to the different shapes.

The procedure to generate the second layout L2 of FIG. 4 from the first layout L1 of FIG. 3 may be based on the PPC. In some example embodiments, as will be described below with reference to FIGS. 11 through 15, the PPC may be performed based on features generated from an initial layout, such as an initial layout image or set of layout data. The feature-based PPC may be performed at least in part based on edge information of patterns such as widths and spaces of the patterns. In some example embodiments, as will be described below with reference to FIGS. 16 through 24, the PPC may be performed based on images. The image-based PPC may be performed such that the images of the layout are processed to predict a critical dimension (CD), and the processed images of the layout may be corrected based on the predicted CD.

The feature-based PPC may be performed with an operation amount of data. For example, the operation amount data involved in the feature-based PPC may be less than the image-based PPC. However, in some cases, the accuracy of the feature-based PPC may be lower than the image-based PPC when the feature-based PPC uses less information than the image-based PPC.

The method and the device according to example embodiments may increase reliability and integration of the layout for the semiconductor processes, and reduce costs and time for designing the semiconductor device by performing the training and the inference of the machine learning module 220 based on the features and/or the images of the layout patterns.

FIGS. 6 through 9 are diagrams for describing vertical features in a method of correcting a layout for semiconductor processes according to example embodiments.

Figure 6:
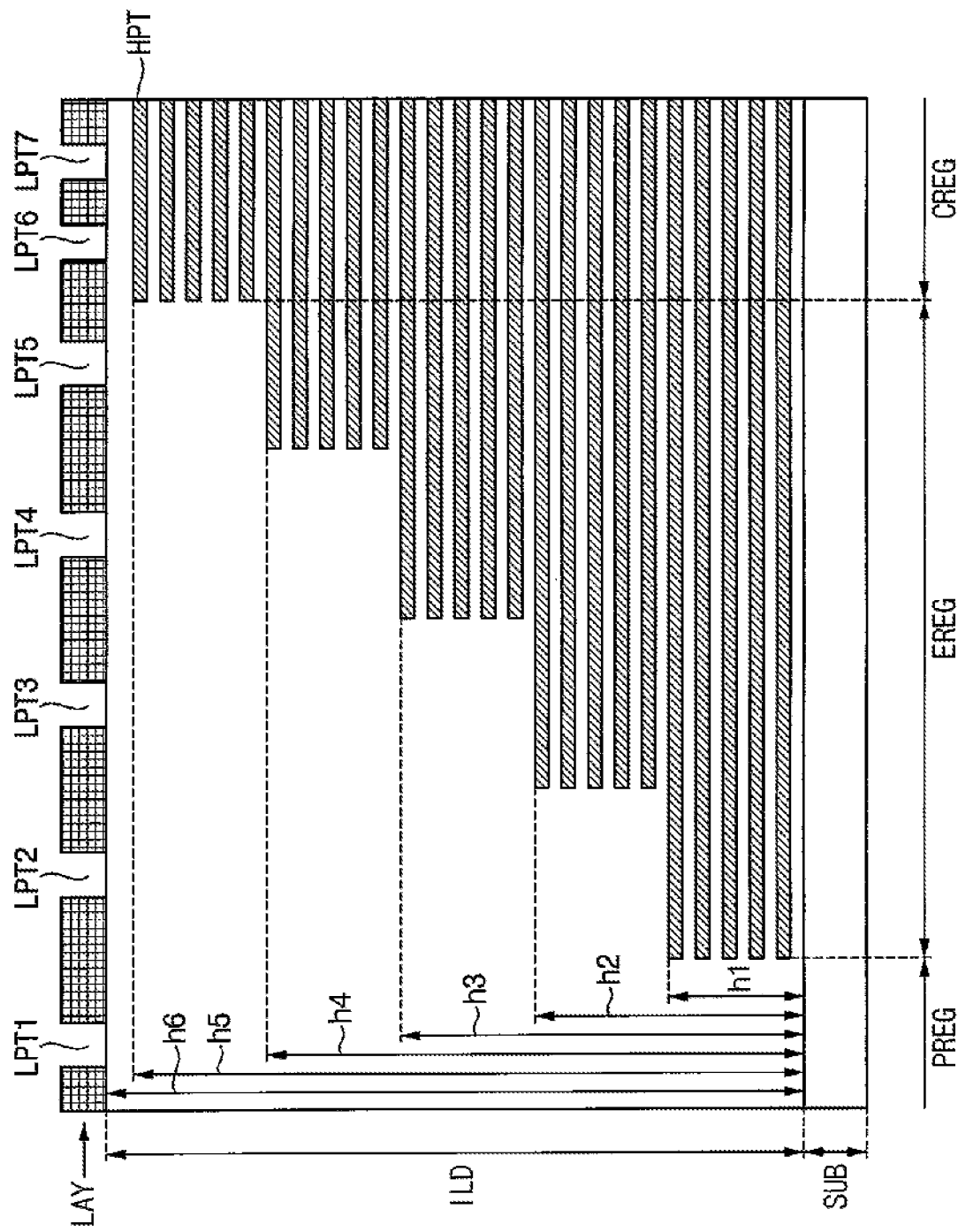
FIGS. 6 through 9 are diagrams for describing vertical features in a method of correcting a layout for semiconductor processes according to example embodiments.
Figure 7:
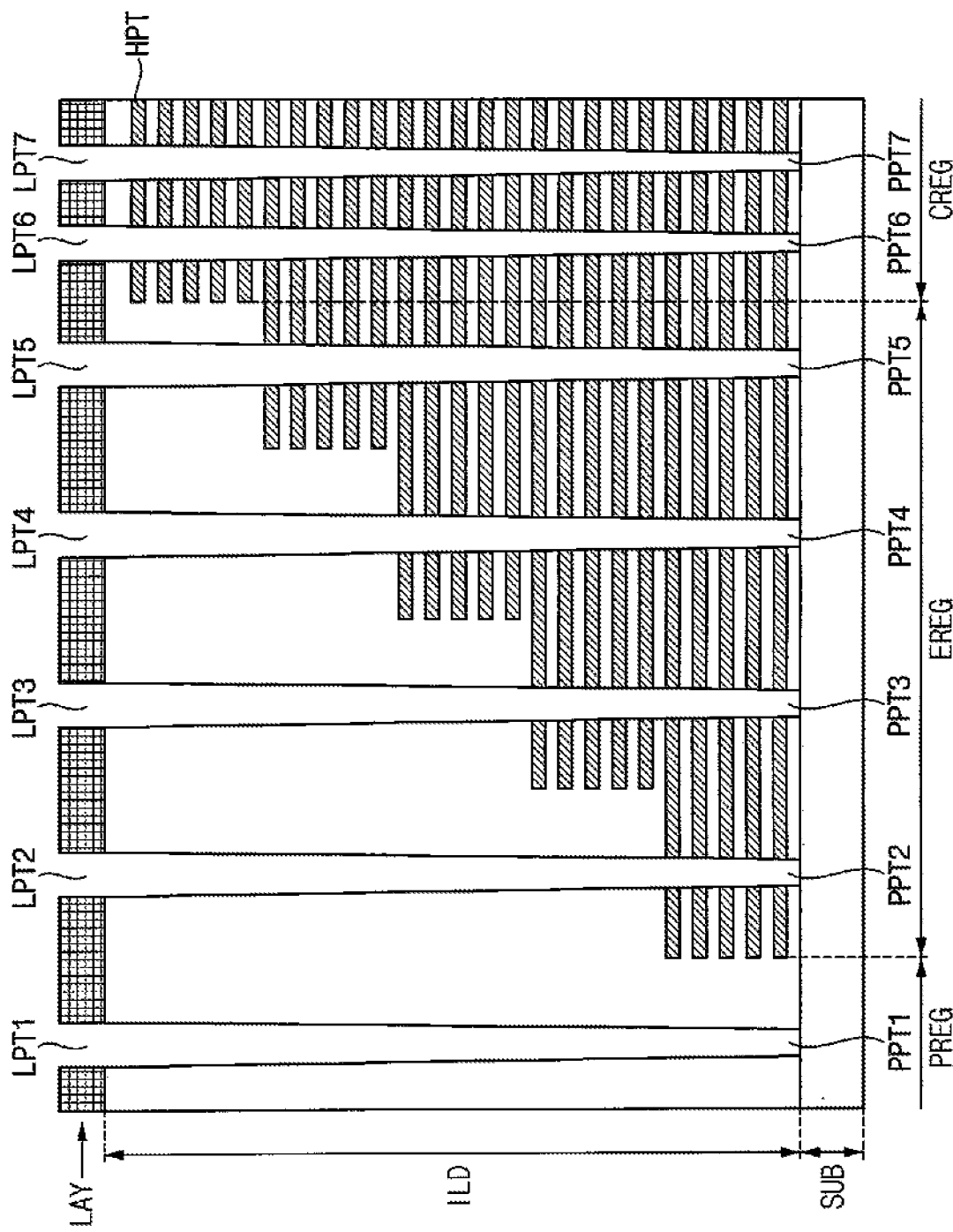

FIGS. 6 and 7 illustrate an example of a semiconductor process (e.g., an etching process) to form process patterns (e.g., etching patterns) PPT1 through PPT7 using a design layout LAY including layout patterns LTP1 through LTP7. The via contacts or NAND cell strings may be formed at the etching patterns PPT1 through PPT7 by semiconductor processes. FIG. 6 illustrates a vertical structure of a semiconductor device before an etching process and FIG. 7 illustrates a vertical structure of the semiconductor device after the etching process.

FIGS. 6 and 7 illustrate an example of vertical NAND flash memory or a VNAND flash memory, in which several hundreds of mold layers are stacked in an upper portion ILD above a semiconductor substrate SUB and stack structures including a various number of layers may be formed for switching per wordline.

For example, the upper portion ILD may be formed with $SiO_2$, and horizontal structure patterns HPT may include mold layers formed of SiN which may be formed within the $SiO_2$. A stack structure may be formed, in which the layers of $SiO_2$ and the layers of SiN are stacked alternately, which may be formed in a cell region CREG, and a peripheral region PREG may be filled with $SiO_2$ alone. An extension region EREG corresponding to an intermediate region may include a stack structure with various heights. With respect to the layout patterns of the design layout, the same patterns may persist until the photoresist process, but the ACI CD (after-cleaning inspection critical dimension) may be different depending on the mode type of a lower structure. In some cases, the different ACI CD may result from a difference in etching selection ratio between $SiO_2$ and SiN. The lower structure may be changed depending on the number of stacks. The lower structure may refer to a structure that is formed in the semiconductor device before the process patterns (e.g., the etching patterns) PPT1 through PPT7 are formed. The layout and/or dimensions of the lower structure may affect the etching patterns PPT1 through PPT7, and the effect(s) of the lower structure on the etching patterns PPT1 through PPT7 may be extracted as the vertical features.

In some example embodiments, the vertical features may include position information indicating a vertical position at which a composition of the lower structure is varied with respect to each of the layout patterns LPT1 through LPT7. FIG. 6 illustrates vertical positions h1 through h6. In some embodiments of the present concept, a "feature" may be represented by a scalar value, though the present disclosure is not necessarily limited thereto. In the example of FIG. 6, it may be determined that the vertical feature of the first layout pattern LPT1 is zero, the vertical feature of the second layout pattern LPT2 is the first vertical position h1, the vertical feature of the third layout pattern LPT3 is the second vertical position h2, the vertical feature of the fourth layout pattern LPT4 is the third vertical position h3, the vertical feature of the fifth layout pattern LPT5 is the fourth vertical position h4, and the vertical features of the sixth and seventh layout patterns LPT6 and LTP7 are the fifth vertical position h5. The layout LAY may be disposed at the sixth vertical position h6.

In some example embodiments, the vertical features may include group information indicating a composition of the lower structure with respect to each of the layout patterns LPT1 through LPT7. In the example of FIG. 6, it may be determined that the vertical feature of the first layout pattern LPT1 which does not include a mold layer in the lower structure is a first group, and the second through seventh layout patterns LPT2 through LPT4 which include a mold layer in the lower structure is a second group.

Figure 8:
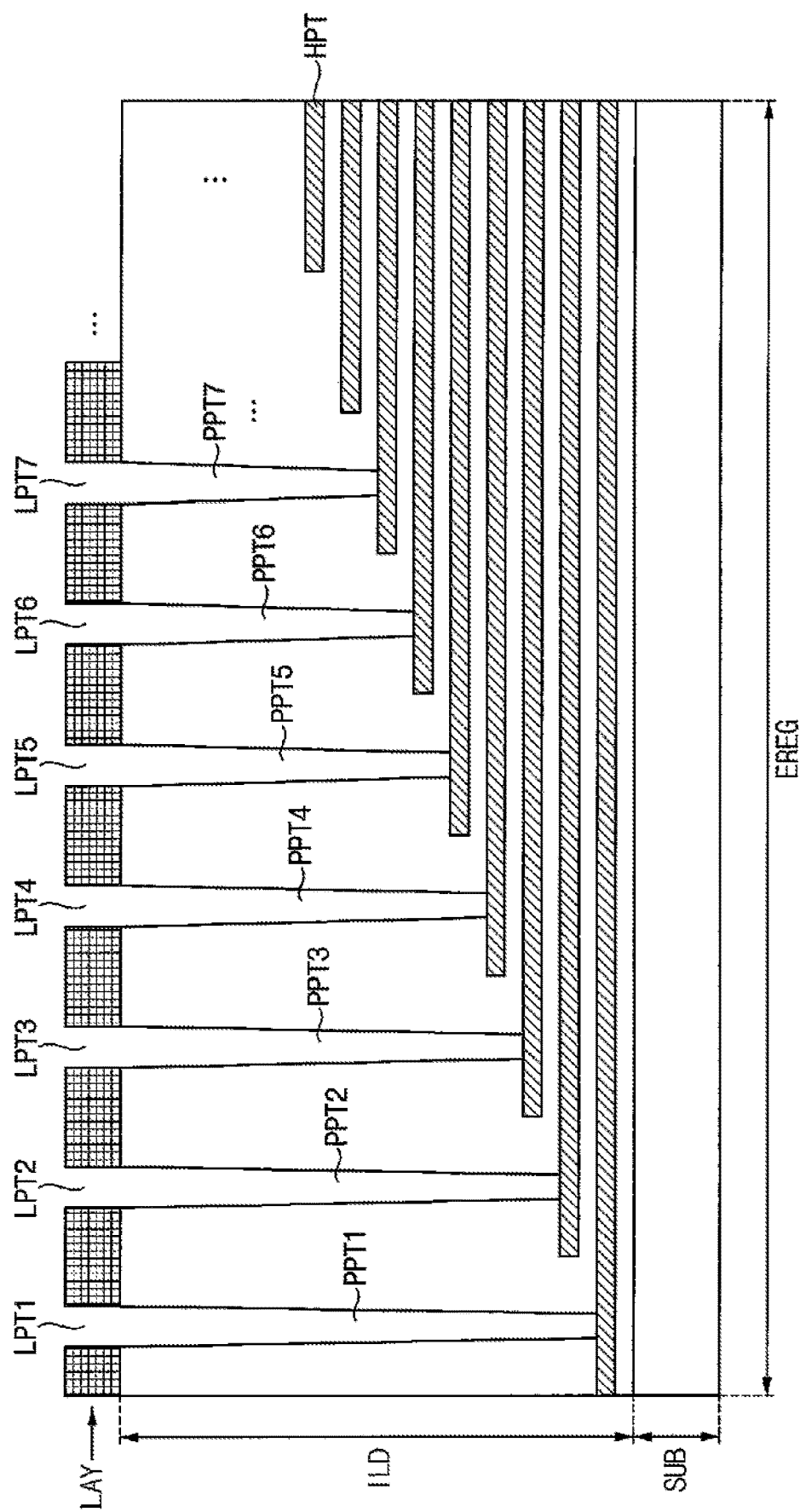

FIG. 8 illustrates an example of etching patterns PPT1 through PPT7 in which the via contacts are formed to electrically connect the horizontal structure patterns HPT corresponding to etch-stopping layers. In this case, the vertical information would further include the vertical positions of the horizontal structure patterns HPT corresponding to the etch-stopping layers of the layout patterns LPT1 through LTP7. In some example embodiments, each vertical position may be represented by the vertical height, or by the number of the horizontal structure pattern HPT which corresponds to the etch-stopping layer of each layout pattern.

Figure 9:
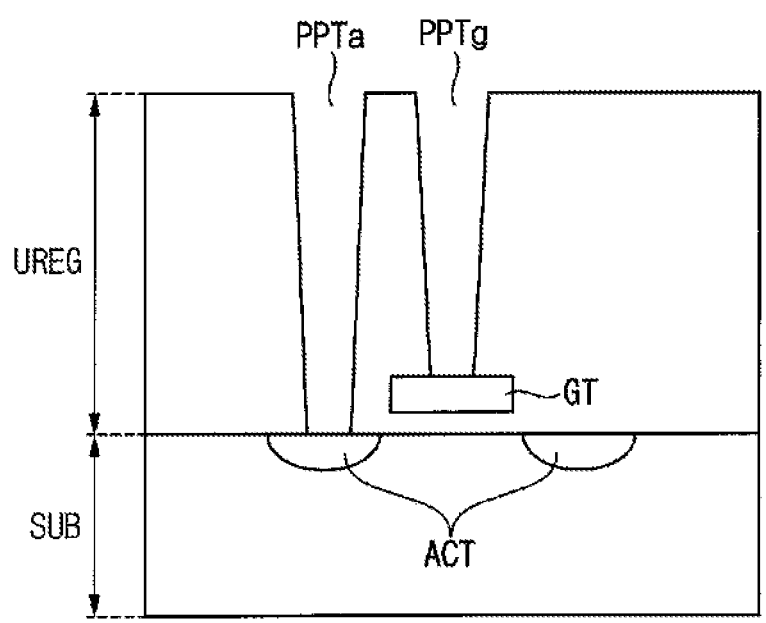

Referring to FIG. 9, active regions ACT may be formed in the semiconductor substrate SUB and a gate GT may be formed between the active regions ACT above the semiconductor substrate SUB. Then, a first etching pattern PPTa for a via contact to connect the active region ACT and a second etching pattern PPTg for a via contact to connect the gate GT may be formed through a single etching process. In this case, the etch-stopping layer of the first etching pattern PPTa corresponds to the first active region ACT and the etch-stopping layer of the second etching pattern PPTg corresponds to the gate GT. In some example embodiments, "group information" may be represented by a value indicating a section in which a certain composition is formed. In some example embodiments, the group information may indicate a composition of an etch-stopping layer corresponding to each of layout patterns. For example, in the embodiment illustrated in FIG. 9, the group information corresponding to the first etching pattern PPTa may indicate the inclusion of a material forming the active region ACT, and the group information corresponding to the second etching pattern PPTg may indicate the inclusion of a material forming the gate GT.

Figure 10:
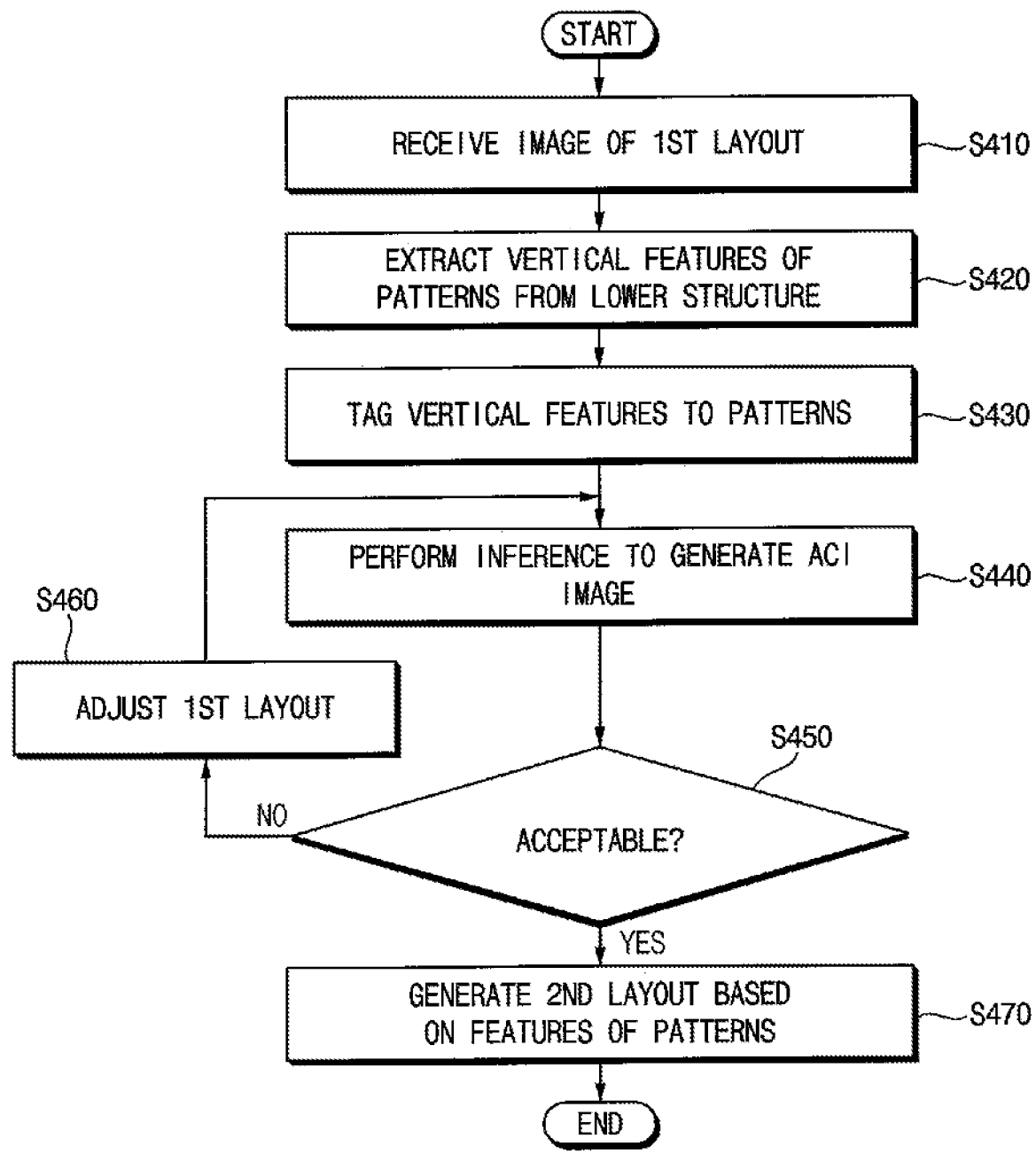
FIG. 10 is a flow chart of a method of correcting a layout for semiconductor processes according to example embodiments.

FIG. 10 is a flow chart of a method of correcting a layout for semiconductor processes according to example embodiments.

According to example embodiments, a method of inference for the machine learning module may include receiving a design layout including layout patterns for a semiconductor process, identifying vertical features of a lower structure of a semiconductor device, generating predicted process pattern data based on the vertical features and the design layout using a machine learning model, comparing the predicted process pattern data and target data for the semiconductor process to obtain comparison data, and updating the design layout based on the comparison data.

Referring to FIGS. 2 and 10, in operation S410, the machine learning module 220 may receive an image of the first layout L1. For example, the first layout L1 may specify patterns required to be obtained in after-cleaning inspection (ACI).

In operation S420, the machine learning module 220 may extract the vertical features of the patterns from the image of the first layout L1. For example, the machine learning module 220 may extract the vertical features based on the lower structure with respect to each of the patterns as described above.

In operation S430, the machine learning module 220 may tag the extracted vertical features to the patterns, respectively. For example, the effects of the lower structure on the patterns during the semiconductor processes (e.g., the etching process) may be represented by data and assigned to the patterns.

In operation S440, the machine learning module 220 may perform an inference with respect to the vertical features and generate an ACI image. For example, the machine learning module 220 may infer the ACI image that is expected based on the first layout L1.

In operation S450, the correction module 240 may determine whether the inferred ACI image is acceptable. For example, the inferred ACI image may be compared with a target ACI image (e.g., the image of the first layout L1) and determine that the inferred ACI image is acceptable if the difference of the inferred ACI image and the target ACI image is smaller than a reference value.

In operation S460, when the inferred ACI image is not acceptable, the correction module 240 may modify the first layout L1. For example, the correction module 240 may adjust the features of the patterns corresponding to pattern dimensions, such as sizes, shapes, etc. According to the adjustment of the features, the effect of each pattern on the neighboring patterns may be changed or updated.

In some example embodiments, the adjustment of the features of the patterns may be performed by the inference based on machine learning. The correction module 240 may perform an inference with respect to the difference between the inferred ACI image and the target ACI image to adjust the first layout L1. For example, the correction module 240 may perform an inference with respect to each of the patterns, with respect to a group of patterns, or an image of patterns.

In operation S440, the machine learning module 220 may perform an inference with respect to the adjusted first layout L1 and generate an ACI image. The machine learning module 220 and the correction module 240 may repeat operations S440 through S460 until the inferred ACI image becomes acceptable. For example, the ACI image may be deemed "acceptable" once it represents a layout having patterns with desired characteristics, which may vary by application of the present inventive concepts.

In operation S470, when the inferred ACI image is acceptable, the correction module 240 may generate a second layout L2 or an ADI image based on the features of the acceptable ACI image. The correction module 240 may generate the second image from the features of the acceptable patterns.

In operation S460 adjusting the first layout L1, the sizes and the shapes of the patterns may be adjusted. Accordingly, an image of the second layout L2 may be generated by adjusting the sizes and the shapes of the patterns based on the adjusted features.

Figure 11:
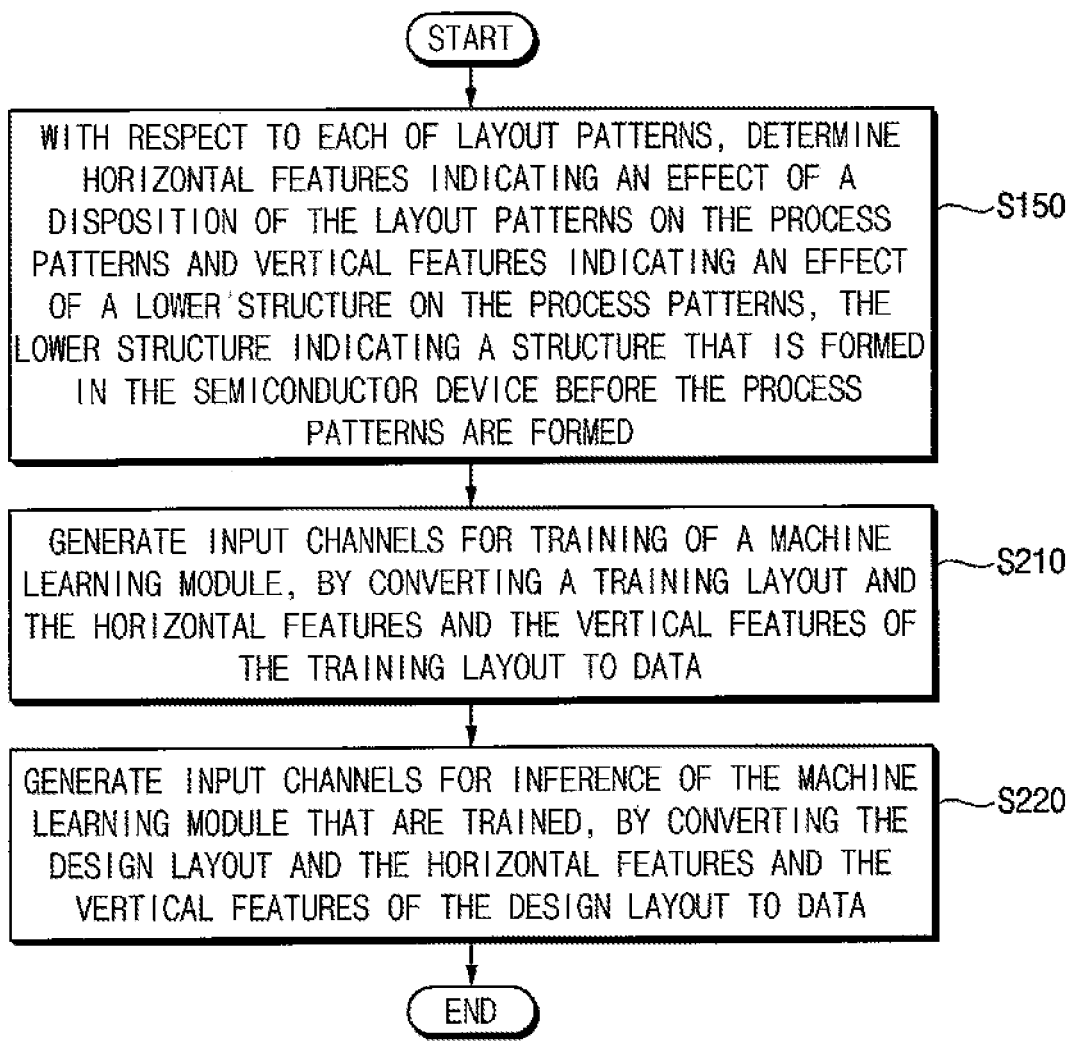
FIG. 11 is a flow chart of an example process for generating an input channel of a machine learning module based on features in a method of correcting a layout for semiconductor processes according to example embodiments.

FIG. 11 is a flow chart of an example process for generating an input channel of a machine learning module based on features in a method of correcting a layout for semiconductor processes according to example embodiments. FIG. 12 is a diagram illustrating an example of input channels of a machine learning module in a method of correcting a layout for semiconductor processes according to example embodiments.

Referring to FIG. 11, with respect to each layout pattern in a plurality of layout patterns, horizontal features and vertical features may be determined where the horizontal features represent effects of a disposition of the layout patterns on the process patterns, and where vertical features indicate an effect of a lower structure on the process patterns (S150). As described above, the lower structure indicates a structure that is formed in the semiconductor device before the process patterns are formed. The horizontal features will be described with reference to FIGS. 12 through 15.

Input channels for training of a machine learning module may be generated by converting a training layout and the horizontal features and the vertical features of the training layout to data (S210).

Input channels to allow the trained machine learning module to perform an inference may be generated by converting the design layout and the horizontal features and the vertical features of the design layout to data (S220).

FIG. 12 illustrates an example embodiment of the input channels based on feature-based machine learning according to the method of FIG. 11.

In FIG. 12, ID indicates identity numbers for each pattern, CDX and CDY indicate sizes of the patterns in a row direction and a column direction, CDCX and CDCY indicate positions of the patterns in the row direction and the column direction, and AR indicates an area of the patterns. For example, CDX, CDY, CDCX, CDCY and AR correspond to the dimensional horizontal features of the patterns.

NUMi (for example, where i=6, 10, 15, 20) indicates the number of neighboring patterns in an influence range capable of affecting each pattern and includes information on density of the patterns, GSi indicates information on distance of the neighboring patterns, VT indicates an effect of an electric field applied to the neighboring patterns during the etching process, and SK indicates skew information caused during the etching process. In NUMi and GSi, the index i indicates the influence range, and accordingly, the radius of the influence range may be increased as the index i is increased. NUMi, GSi, VT and SK correspond to the horizontal features indicating effects of the neighboring patterns.

VP indicates the position information, for example, a vertical position at which a composition of the lower structure is varied with respect to each of the layout patterns. GR indicates group information indicating a composition forming the lower structure with respect to each of the layout patterns. VP and GR correspond to the vertical features indicating an effect of a lower structure on the process patterns.

Hereinafter, the horizontal features indicating the effect of the neighboring patterns are described with reference to FIGS. 13 through 15. The vertical features are the same as described with reference to FIGS. 6 through 9.

Figure 13:
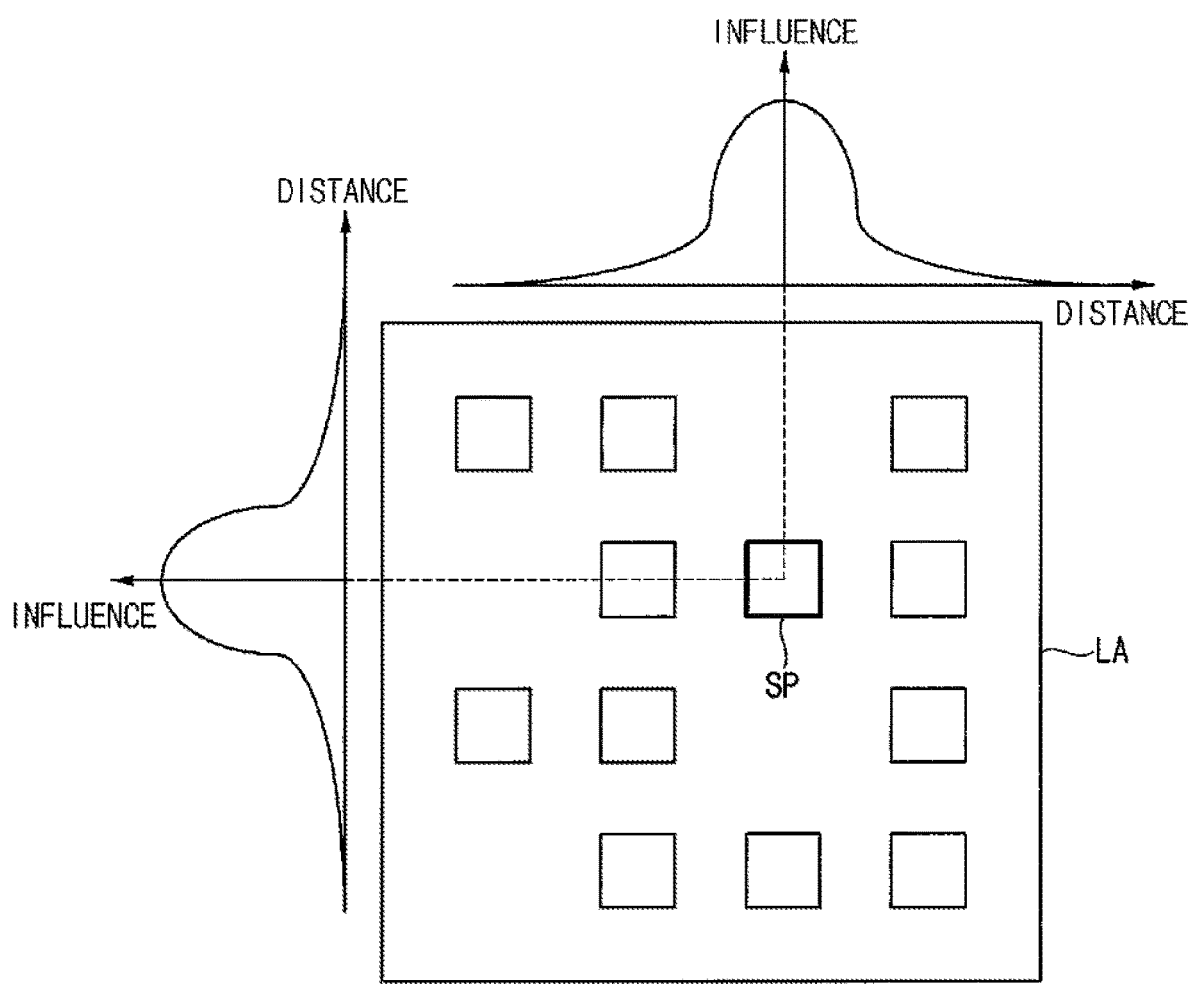
FIGS. 13 through 15 are diagrams illustrating horizontal features in a method of correcting a layout for semiconductor processes according to example embodiments.
Figure 14:
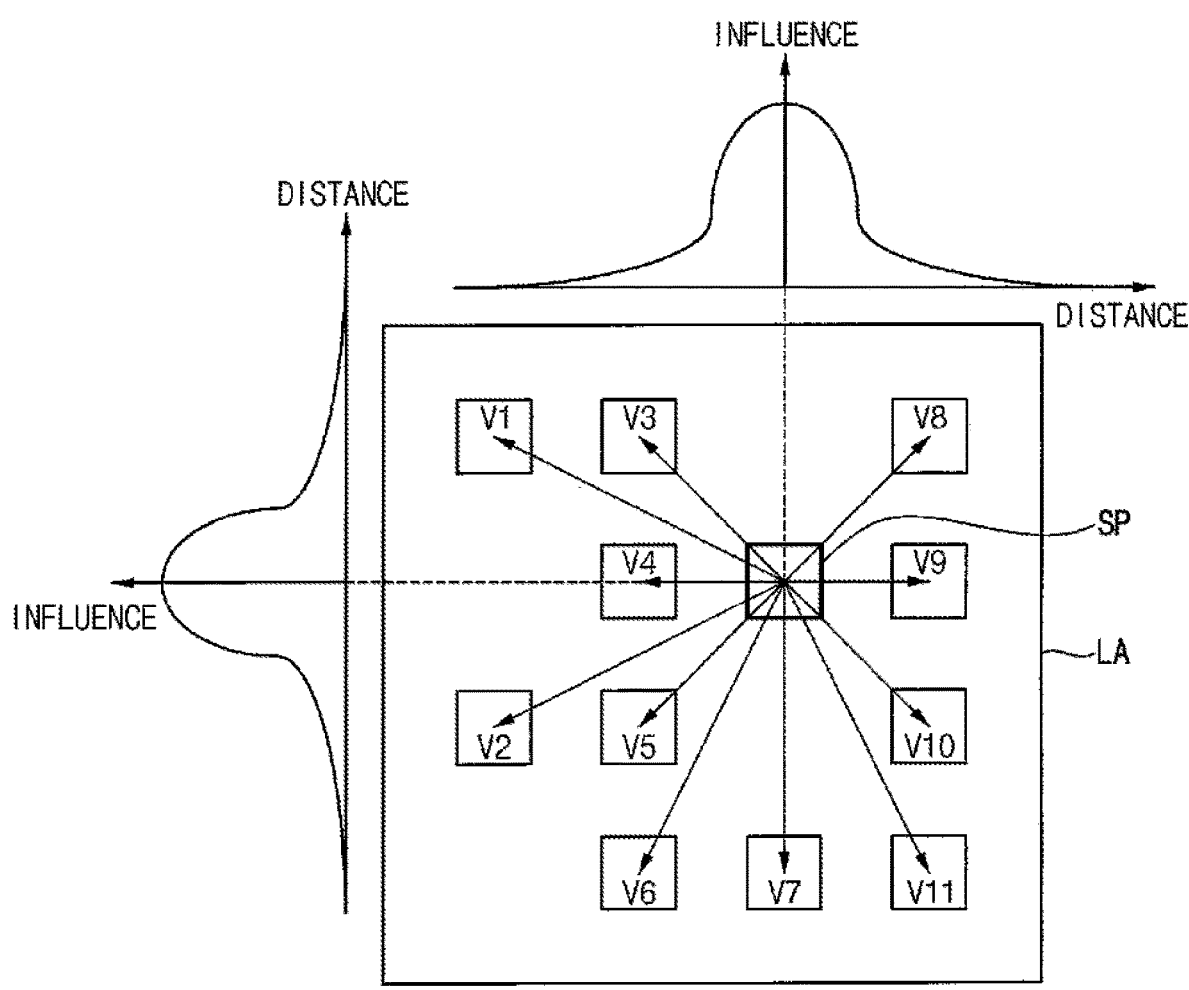
Figure 15:
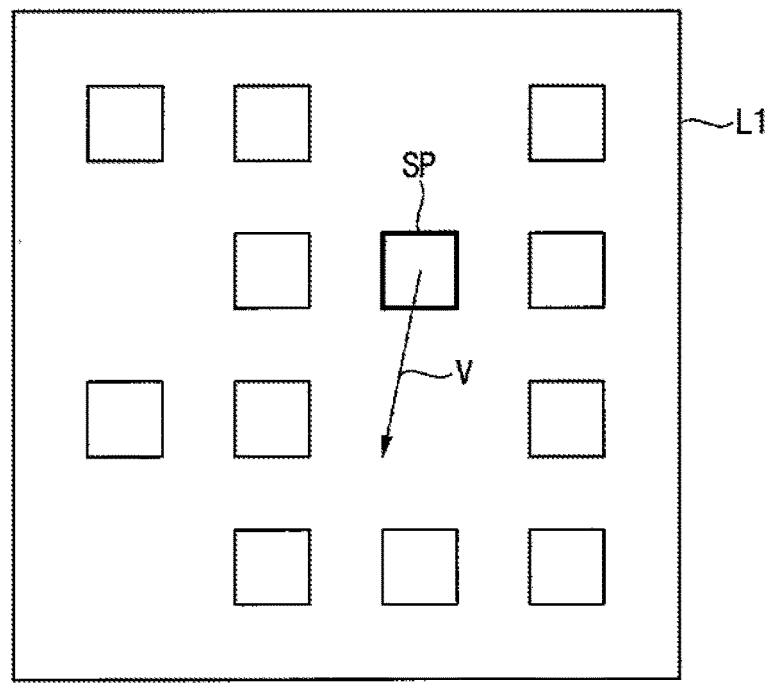

FIGS. 13 through 15 are diagrams illustrating horizontal features in a method of correcting a layout for semiconductor processes according to example embodiments.

FIG. 13 illustrates a first example of measuring an effect of neighboring patterns on a particular pattern (e.g., a selected pattern) as a horizontal feature. In FIG. 13, a selected pattern SP is represented by a bold rectangular. For example, information on distance of the neighboring patterns may be represented by Expression 1.

$$\sum_{i \neq i_0 \in R} A_i e^{-(\vec{r}_i - \vec{r}_0)^2/\sigma^2} \qquad \text{Expression 1}$$

In expression 1, R indicates the patterns that affect the selected pattern SP. In the example model described by Expression 1, it is assumed that the neighboring patterns in a predetermined influence range may affect the selected pattern SP. The size of the influence range may be smaller than the size of the image of the layout. $I_0$ indicates an identity number of the selected pattern SP, and $\vec{r}_0^*$ indicates a position vector of the selected pattern SP in a coordinate system of an image. $A_i$ indicates a size of an i-th pattern (i is a positive integer smaller than R), and $\vec{r}_i^*$ indicates a position vector of the i-th pattern.

For example, the disposition of the neighboring patterns may be extracted as a Gaussian distribution as Expression 1, where σ indicates a weight, for example, a decay of the Gaussian distribution. The weight may be determined according to process characteristics such as temperature and time of the semiconductor process, and pitch, line width, composition of patterns.

The effect of the neighboring pattern on the selected pattern SP may decrease as the distance between the neighboring pattern and the selected pattern SP is increased. The feature related with the disposition of the neighboring patterns may be extracted with respect to each pattern.

FIGS. 14 and 15 illustrate a second example of extracting an effect of neighboring patterns on a particular pattern (e.g., a selected pattern) as a horizontal feature. In FIGS. 14 and 15, a selected pattern SP is represented by a bold rectangular. For example, an effect of an electric field applied to the neighboring patterns during the etching process may be extracted as a horizontal feature. The effect of the electric field may be represented by Expression 2.

$$\left| \sum_{i \neq i_0 \in R} A_i e^{-\frac{(\vec{r}_i - \vec{r}_0)^2}{\sigma^2}} \frac{\vec{r}_i}{|\vec{r}_i|} \right|^2 \qquad \text{Expression 2}$$

The value of Expression 2 may correspond to a sum of the position vectors of the neighboring patterns. In some examples, the magnitudes of the position vectors may be normalized and may be replaced with Expression 1.

For example, the sum of the first through eleventh position vectors V1 through V11 illustrated in FIG. 14 may be a vector V illustrated in FIG. 15. The magnitude of the vector V may be extracted as the horizontal feature indicating the effect of the electric field.

In addition, the effect of the neighboring patterns on an etching skew of the selected pattern SP may be represented by Expression 3.

$$\left| \sum_{i \neq i_0 \in R} A_i e^{-(\vec{r}_i - \vec{r}_0)^2/\sigma^2} e^{i2(\theta_i - \theta_0)} \right|^2 \qquad \text{Expression 3}$$

In Expression 3, $\theta_0$ indicates a phase of the selected pattern SP in the coordinate system of the image, and $\theta_i$ indicates a phase of an i-th pattern. According to Expression 3, the horizontal feature related with the etching skew may be extracted by correcting, with magnification of, for example, two, the angle information of the position vectors of the neighboring patterns around the selected pattern SP and reflecting harmonics to the features of Expression 1.

In general, the information may be corrected with magnification of m (m is a positive integer). Additionally or alternatively, the feature related with the etching skew may be extracted using an orthogonal basis function such as a Bessel function instead of reflecting the harmonics.

In Expression 1, Expression 2 and Expression 3, methods of extracting the horizontal features are described referring to the polar coordinate system. The coordinate system is not limited to the polar coordinate system and various coordinate systems may be used to extract the horizontal features.

The feature-based machine learning module may be implemented based on the horizontal features and the vertical features as described above.

In some example embodiments, the machine learning module 220 in FIG. 2 may perform a first inference based on linear regression with respect to the horizontal features and the vertical features and perform a second inference based on nonlinear regression with respect to a result of the first inference.

The first inference based on linear regression may be characterized by the inference result converging on one position. In contrast, the result of the second inference based on nonlinear regression may diverge to two positions. To prevent the divergence of the inference result, the machine learning module 220 in FIG. 2 may perform the first inference based on linear regression before the second inference is performed thereon based on nonlinear regression.

The accuracy of the first inference based on linear regression may be lower than the accuracy of the second inference based on nonlinear regression. Accordingly, the machine learning module 220 may further perform the second inference based on nonlinear regression. By performing both the first and second inference, the inference result may not diverge and the machine learning module 220 may perform the inference stably and accurately.

At least one of various algorithms such as support vector machine (SVM), random forest, etc. may be used in addition to the linear and nonlinear regressions. In some example embodiments, the machine learning module 220 may perform multiple inferences using two or more algorithms and perform an ensemble algorithm to select best one among the results of the multiple inferences.

In some example embodiments, the methods described with reference to FIGS. 11 through 15 may be performed on an image of a short-range. For example, the range of the images processed by the machine learning module 220 may vary with an operation capacity of the processor executing the machine learning module 220. For example, the methods of FIGS. 11 through 15 may be performed on images having a size within one micrometer.

The physical semiconductor processes such as the etching process are performed by a scale larger than one micrometer. For example, the semiconductor processes may be performed by unit of several millimeters or several centimeters.

In some example embodiments, a layout of all of the semiconductor processes may be divided into grids, and the horizontal features and the vertical features as described above may be tagged to each grid. The features tagged to each grid may be used instead of the features tagged to each pattern. Accordingly, long-range effects may be modeled efficiently with a reduction in effort and/or computational resources.

Figure 16:
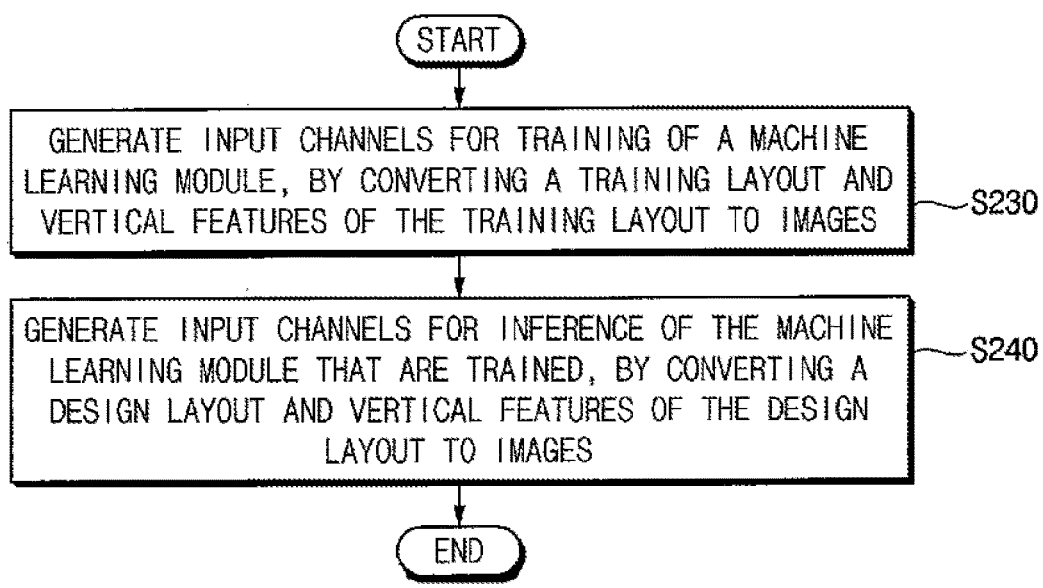
FIG. 16 is a flow chart of an example process for generating input channels of a machine learning module based on images in a method of correcting a layout for semiconductor processes according to example embodiments.

FIG. 16 is a flow chart of an example process for generating input channels of a machine learning module based on images in a method of correcting a layout for semiconductor processes according to example embodiments.

Referring to FIG. 16, input channels for training of a machine learning module may be generated by converting a training layout and vertical features of the training layout to images (S230). Input channels for the trained machine learning module to perform an inference may be generated by converting a design layout and vertical features of the design layout to images (S240).

In some example embodiments, as will be described below with reference to FIGS. 19A and 19B, the dimensional horizontal features of the patterns and the horizontal features indicating the effect of the neighboring patterns may be converted to one image and the vertical features indicating the effect of the lower structure may be converted to another image. For example, the training layout may be converted to a set of first images, the vertical features of the training layout may be converted to a set of second images, and the set of first images and the set of second images may be provided as the input channels for training of the machine learning module. Additionally or alternatively, the design layout may be converted to third images, the vertical features of the design layout may be converted to fourth images, and the third images and the fourth images may be provided as the input channels for inference of the trained machine learning module.

In some example embodiments, as will be described below with reference to FIG. 20, the dimensional horizontal features of the patterns, the horizontal features indicating the effect of the neighboring patterns, and the vertical features indicating the effect of the lower structure may be combined into one image. For example, the training layout and the vertical features of the training layout may be converted to first combined images, and the first combined images may be provided as the input channels for training of the machine learning module. Additionally or alternatively, the design layout and the vertical features of the design layout may be converted to second combined images, and the second combined images may be provided as the input channels for inference of the trained machine learning module.

Figure 17A:
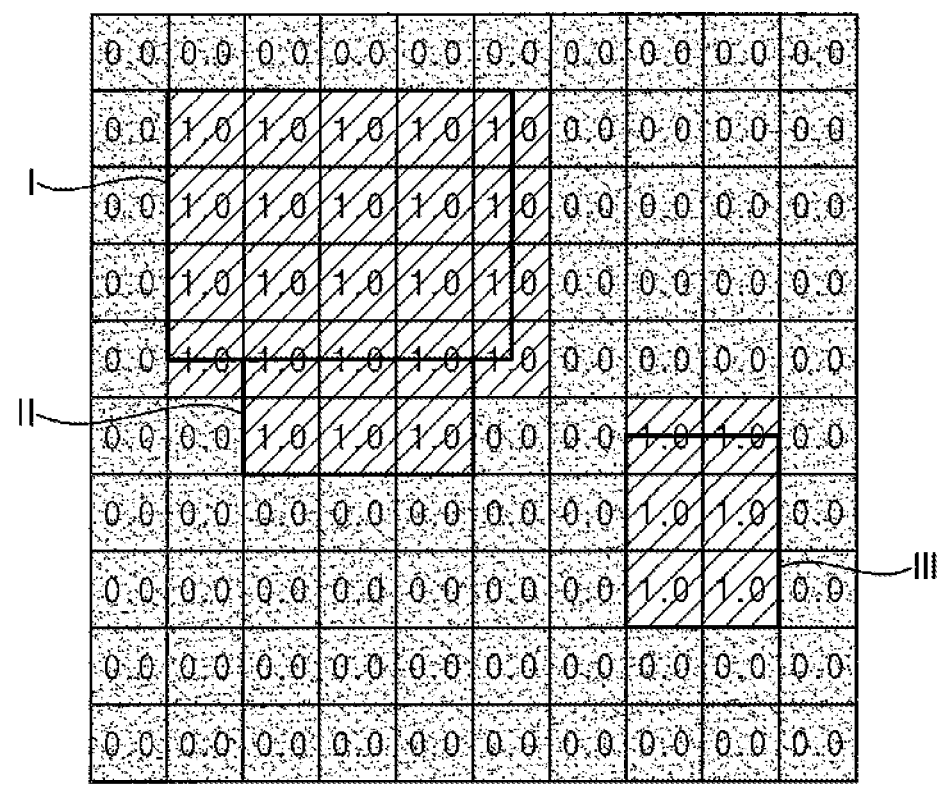
Figure 17B:
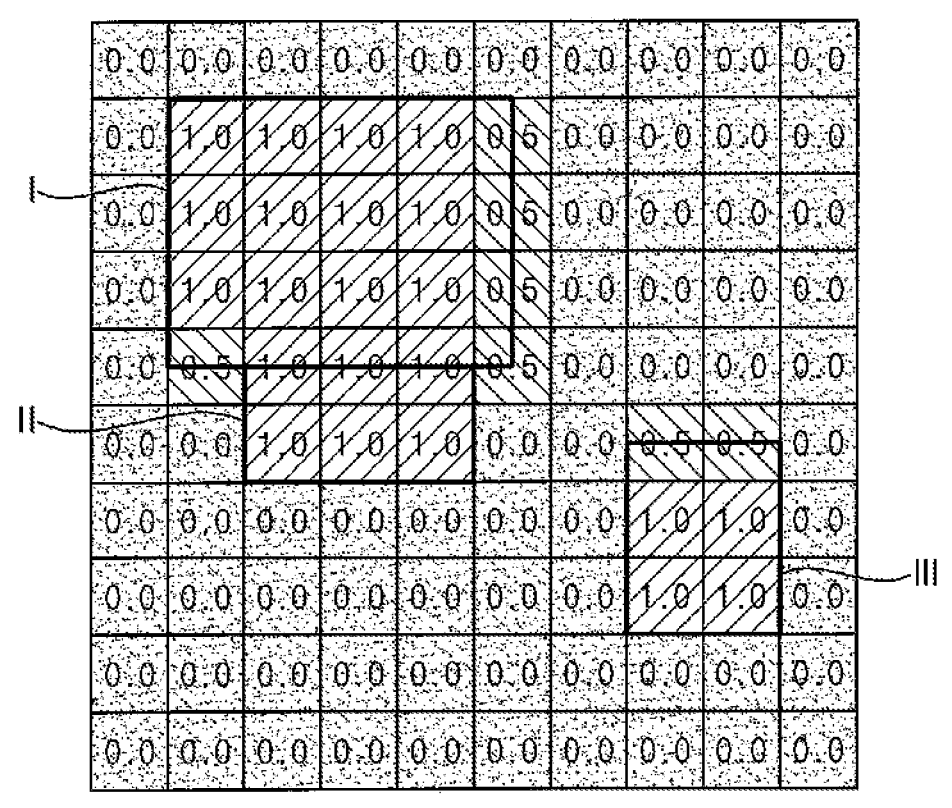
Figure 17C:
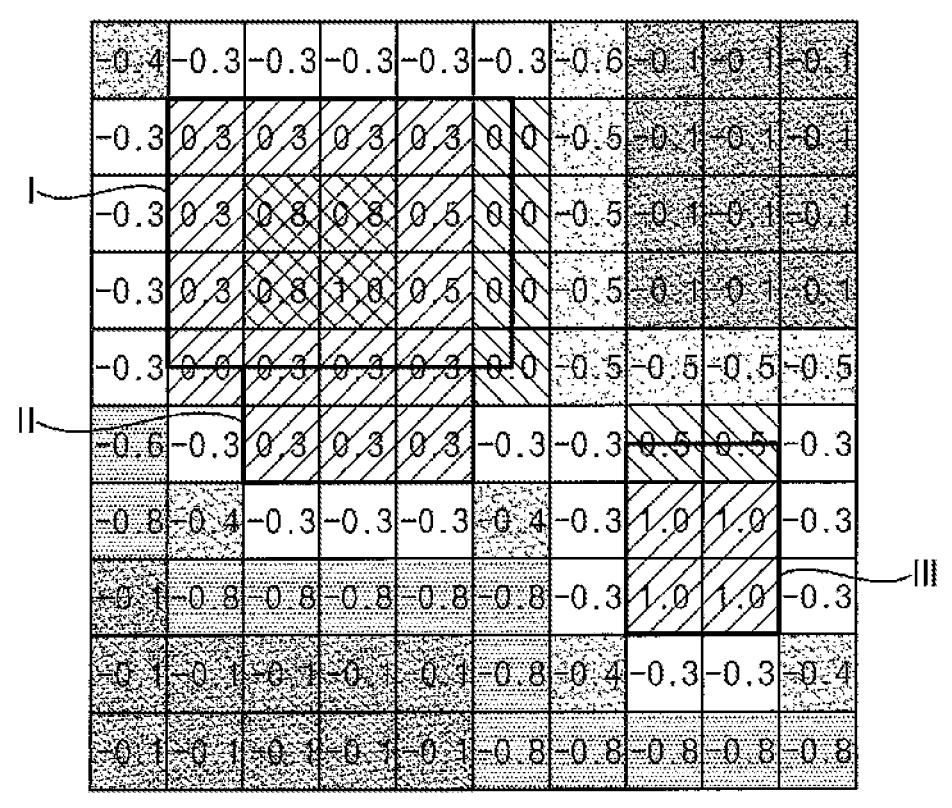

FIGS. 17A through 17C are diagrams illustrating example embodiments of an image conversion in a method of correcting a layout for semiconductor processes according to example embodiments.

Referring to FIG. 17A, to perform the PPC and/or the OPC, at least one processor of the processors 110 in FIG. 2 may convert the layout for the semiconductor processes to an image using a binary scheme.

For example, the pixels in the regions I, II and III to be corrected by the machine learning and correction modules 220 and 240 may be designated to "1" and the pixels in the other regions may be designated to "0". In some cases, the accuracy of correction may be degraded because the pixels in the boundaries of the regions I, II and III are designated to "1" or "0". However, the turn around time (TAT) may be reduced through the simplification of the conversion. In some example embodiments, the pixels in the regions I, II and III to be corrected by the machine learning and correction modules 220 and 240 may be designated to "0" and the pixels in the other regions may be designated to "1".

Referring to FIG. 17B, at least one processor of the processors 110 in FIG. 2 may convert the layout for the semiconductor processes to an image using an area overlap scheme.

For example, the pixels in the regions I, II and III to be corrected may be designated to "1" and the pixels in the other regions may be designated to "0". In addition, the pixels in the boundaries of the regions I, II and III may be designated to "0.5".

Through such conversion, the accuracy of correction may be increased in comparison with the binary scheme. However, the amount of information to be processed is increased by the intermediate values designated to the pixels, and the TAT by the area overlap scheme may be increased in comparison with the TAT by the binary scheme.

Referring to FIG. 17C, at least one processor of the processors 110 in FIG. 2 may convert the layout for the semiconductor processes to an image using a level set scheme.

For example, the pixels in the boundary of the regions I, II and III to be corrected may be designated to "0". The pixels within the regions I, II and III may be designated to values (e.g., 0.3, 0.5, 0.8, and 1.0) greater than "0" depending on the distance from the pixels designated to "0". In addition, the pixels outside the regions I, II and III may be designated to values (e.g., −0.1, −0.3, −0.4, −0.5, −0.6, and 0.8) less than "0" depending on the distance from the pixels designated to "0". The accuracy of correction using the level set scheme may be increased in comparison with the binary scheme and the area overlap scheme. However, the amount of information to be processed is increased by the further intermediate values designated to the pixels, the TAT by the level set scheme may be increased in comparison with the TAT by the binary scheme and the area overlap scheme.

The at least one processor of the processors may select the proper scheme for efficiently converting the layout to the image among the binary scheme, the area overlap scheme and the level set scheme.

Figure 18:
FIG. 18 is a diagram illustrating an example of converting vertical features to an image in a method of correcting a layout for semiconductor processes according to example embodiments.

FIG. 18 is a diagram illustrating an example of converting vertical features to an image in a method of correcting a layout for semiconductor processes according to example embodiments.

FIG. 18 depicts an example image that is converted from the position information indicating the vertical position at which a composition of the lower structure is varied with respect to each of the layout patterns. In some example embodiments, the darker portion indicates the greater vertical position among the vertical positions h1 through h7 described with reference to in FIG. 6. In some example embodiments, the image may be generated such that the brighter portion indicates the greater vertical position.

In some embodiments, when the vertical features include both of the position information and the group information, the vertical features may be converted to a color image. For example, the luminance value of the color image may indicate the position information and the color value of the color image may indicate the group information.

Figure 19A:
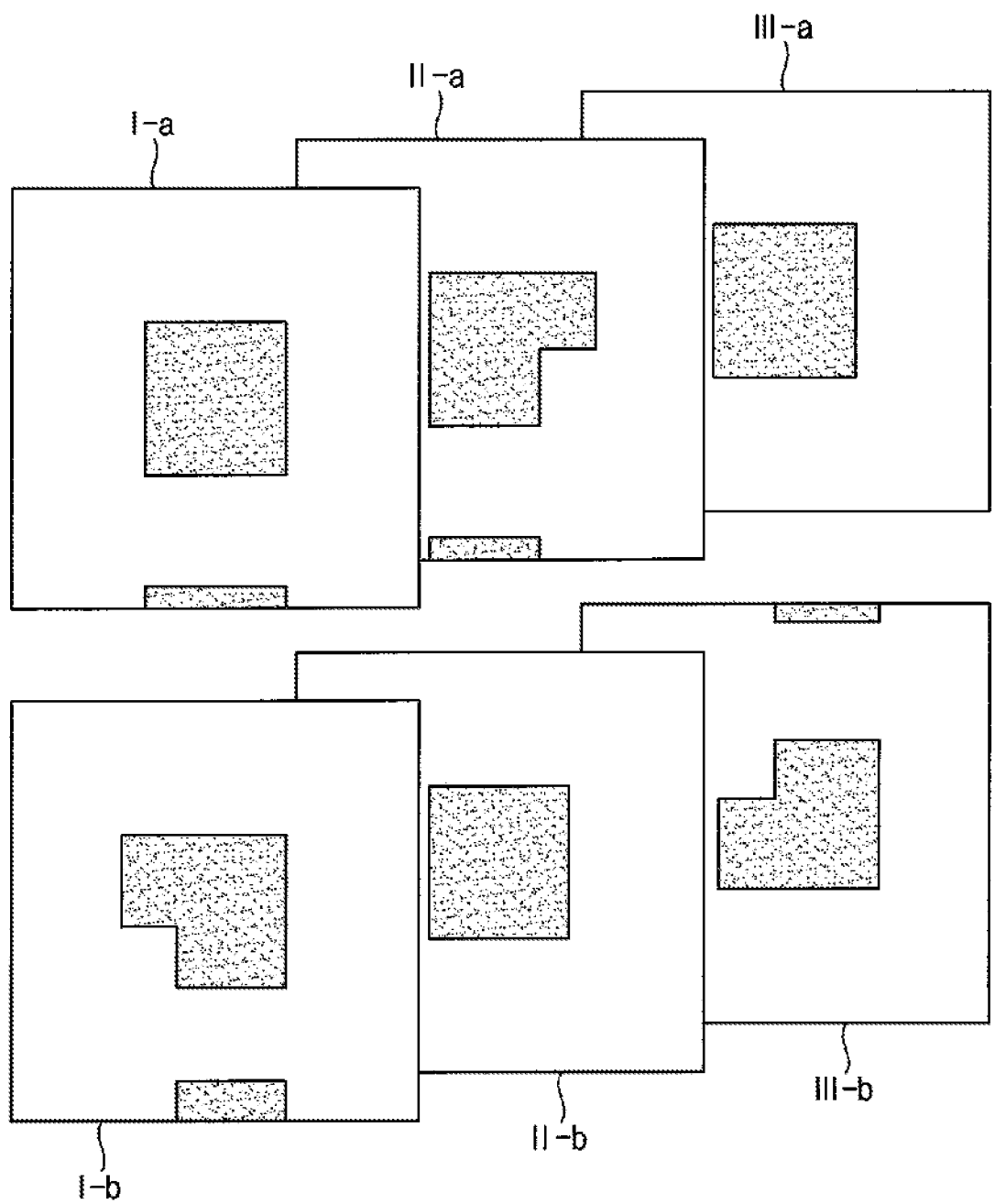
FIGS. 19A and 19B are diagrams illustrating an example of input channels of a machine learning module in a method of correcting a layout for semiconductor processes according to example embodiments.
Figure 19B:
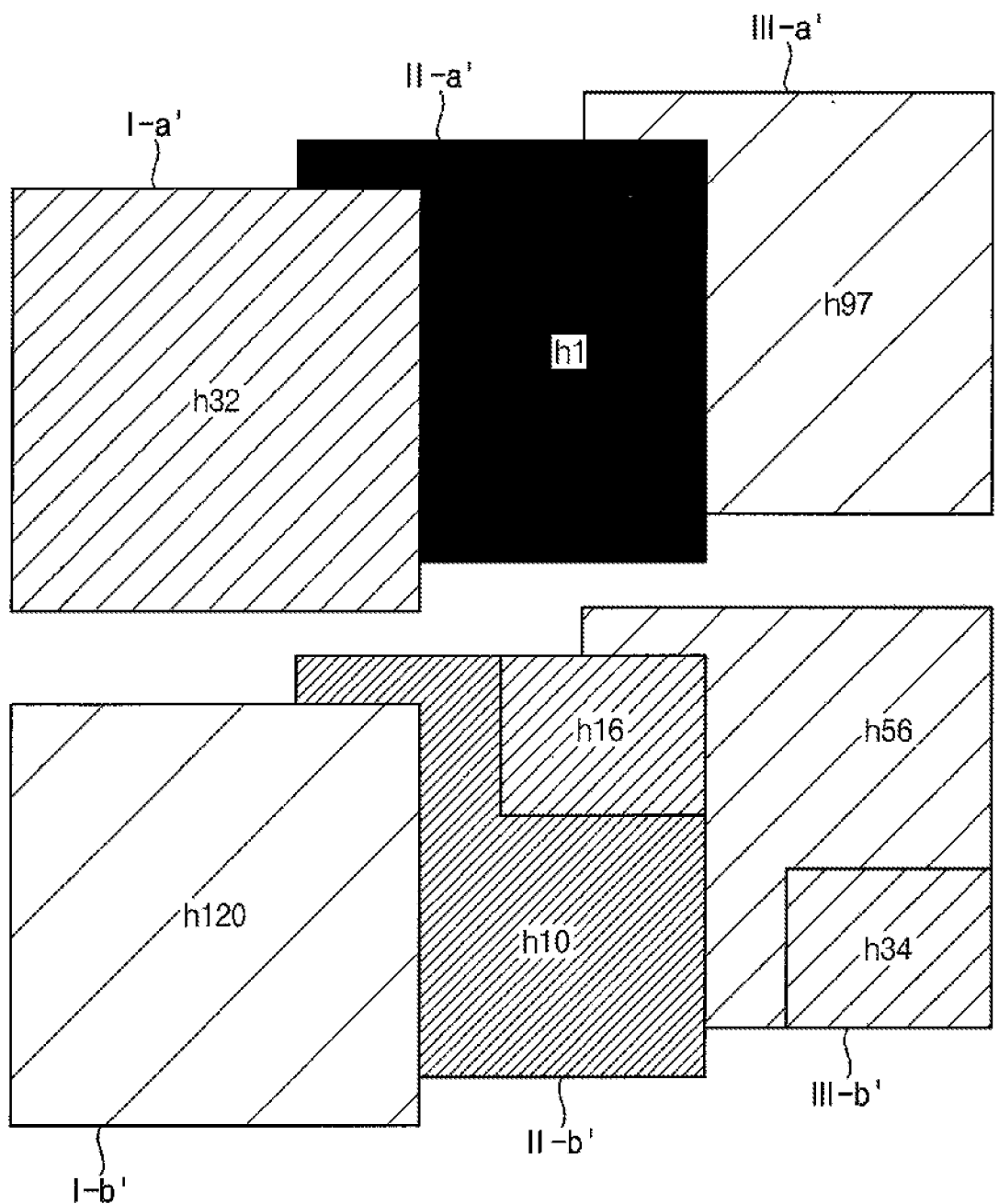

FIGS. 19A and 19B are diagrams illustrating an example of input channels of a machine learning module in a method of correcting a layout for semiconductor processes according to example embodiments.

FIGS. 19A and 19B illustrates an example embodiment where the original converted images are used as the input channels of the machine learning module 220 in FIG. 2. In some example embodiments, the original converted images may be zoomed in or zoomed out with multiple magnifications as will be described below with reference to FIGS. 23A through 24.

Referring to FIGS. 19A and 19B, at least one processor of the processors 110 in FIG. 2 may use the converted images, for example, without magnification, as the input channels of the machine learning module 220.

For example, at least one processor of the processors 110 may generate the input channels of the machine learning module 220 without magnifying the converted images including the patterns I-a, I-b, II-a, II-b, III-a, and III-b as illustrated in FIG. 19A. Additionally or alternatively, at least one processor of the processors 110 may generate the input channels of the machine learning module 220 by converting the vertical features (e.g., the vertical positions h1, h10, h16, h32, h34, h97 and h120) as described above to gray images I-a', I-b', II-a', II-b', and III-b' which respectively correspond to the patterns I-a, I-b, II-a, II-b, III-a, and III-b as illustrated in FIG. 19B.

Figure 20:
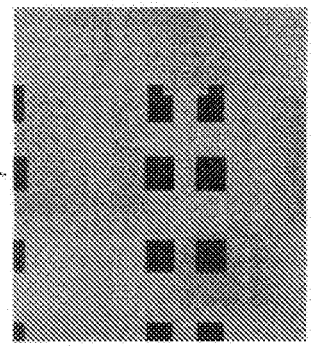
FIG. 20 is a diagram illustrating an example of input channels of a machine learning module in a method of correcting a layout for semiconductor processes according to example embodiments.

FIG. 20 is a diagram illustrating an example of input channels of a machine learning module in a method of correcting a layout for semiconductor processes according to example embodiments.

Example TIF images may be referenced by file names. One example of the TIF images is illustrated in FIG. 20. Each of the images in FIG. 20 corresponds to a combined image which includes the dimensional horizontal features of the patterns, the horizontal features indicating the effect of the neighboring patterns, and the vertical features indicating the effect of the lower structure.

In addition, FIG. 20 illustrates measured data GDSX, GDSY, MFAXCD and AVCD corresponding to the process patterns that are formed by physical processes using the training layout. GDSX indicates a position of the process pattern in the row direction, GDSY indicates a position of the process pattern in the column direction, MFAXCD indicates a critical dimension of a major axis of the process pattern and AVCD indicates an average critical dimension of the process pattern.

According to example embodiments, a method for training the machine learning module may include receiving a training layout including layout patterns for a semiconductor process, identifying vertical features of a lower structure of a semiconductor device, generating predicted process pattern data based on the vertical features and the training layout using a machine learning model, comparing the predicted process pattern data and measured data to obtain comparison data, wherein the measured data is based on process patterns resulting from the training layout, and updating parameters of the machine learning model based on the comparison.

Hereinafter, an example embodiment of generating an ACI image using the machine learning module 220 in FIG. 2 is described with reference to FIG. 21.

Figure 21:
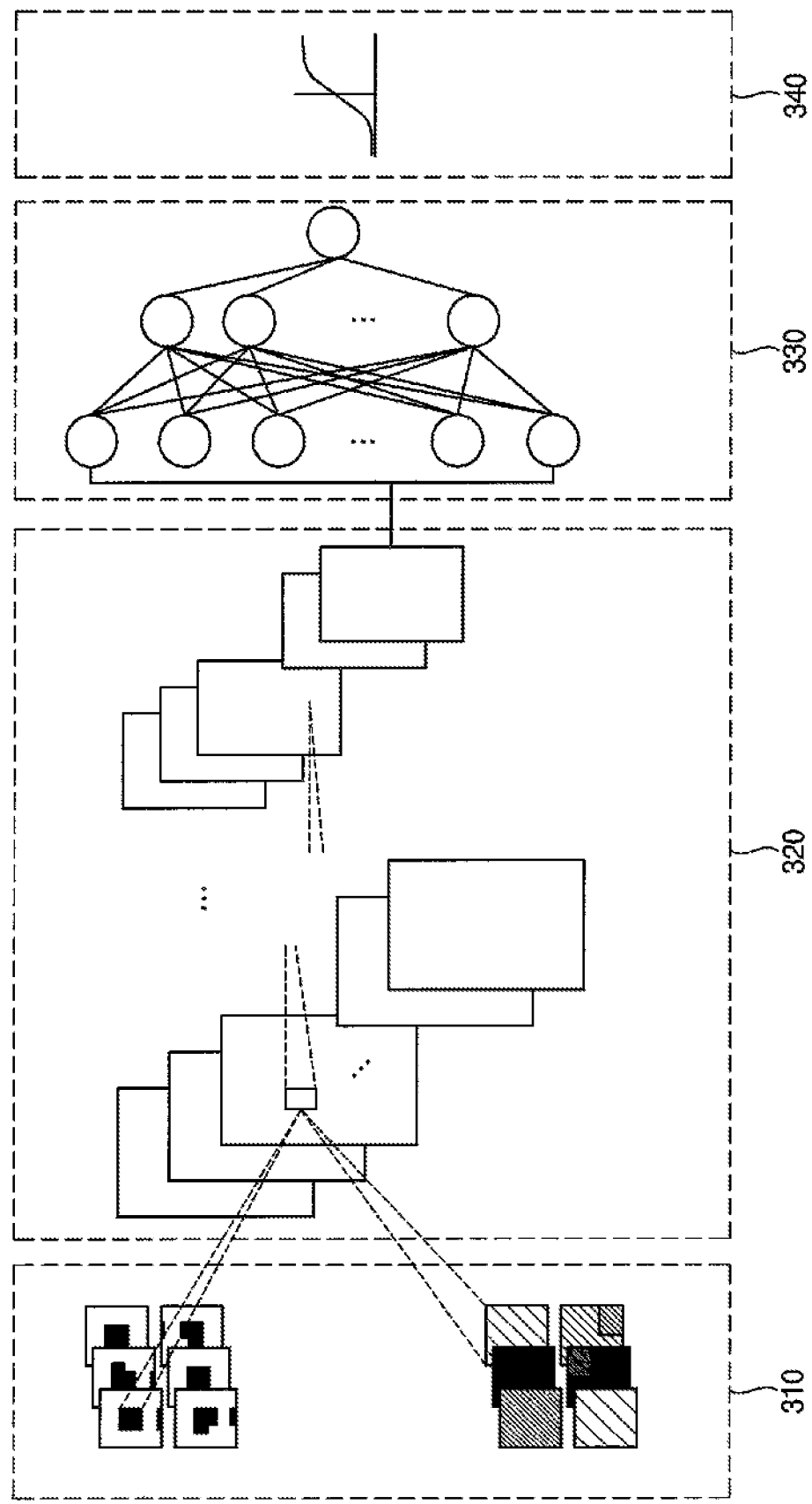
FIG. 21 is a diagram illustrating a machine learning module performing a method of correcting a layout for semiconductor processes according to example embodiments.

FIG. 21 is a diagram illustrating a machine learning module performing a method of correcting a layout for semiconductor processes according to example embodiments.

Referring to FIGS. 2 and 21, the machine learning module 220 may generate the ACI image based on a neural network. For example, the machine learning module 220 may generate the ACI image using convolutional neural network (CNN) as will be described. In some example embodiments, the machine learning module 220 may generate the ACI image using generative adversarial network (GAM), an artificial neural network, or by another type of neural network.

The machine learning module 220 may receive, as input channels 310, the images converted from the horizontal features as illustrated in FIG. 19A and the images converted from the vertical features as illustrated in FIG. 19B. In some example embodiments, the machine learning module 220 may further receive the pattern information on the layout to add to the input channels of a CNN 320. For example, the pattern information may include the number of patterns in the layout, the respective areas of the patterns in the layout, the density of the patterns in the layout, etc.

A plurality of convolution layers may be disposed in the CNN 320. In some embodiments, pooling layers may be disposed between the convolution layers. The outputs from the CNN 320 may be input to a fully connected neural network (FCNN) 330. The FCNN 330 may include a plurality of fully connected layers.

An ACI image output from the FCNN 330 may be updated repeatedly through a feedback network 340. The repeated operation by the feedback network 340 will be described with reference to FIG. 22.

The correction module 240 may determine whether the error value of the ACI image output from the machine learning module 220 exceeds an acceptable range, for example, a reference value. When the error value exceeds the acceptable range, the correction module 240 may adjust the layout and convert the adjusted layout to an image. The procedure of converting the adjusted layout to image is described with reference to FIG. 22.

Figure 22:
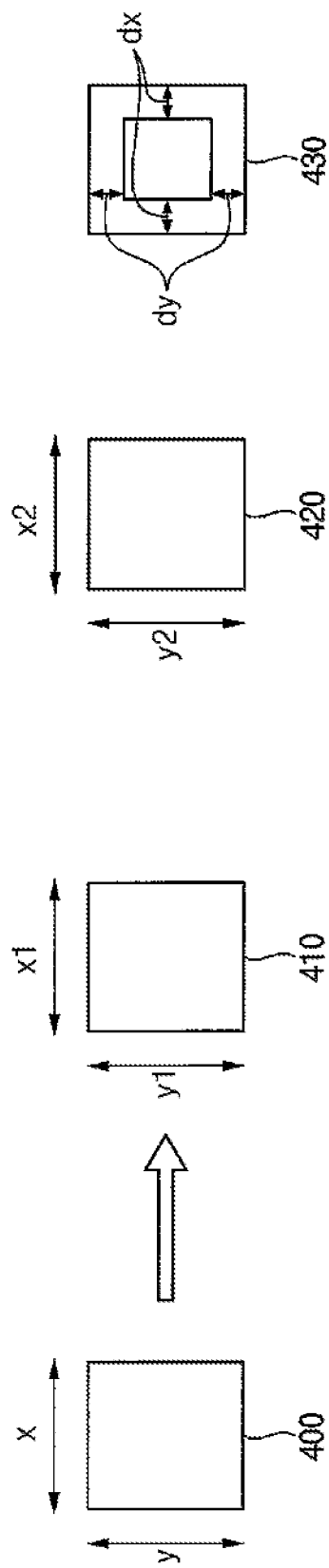
FIG. 22 is a diagram illustrating a procedure of correcting a layout according to example embodiments.

FIG. 22 is a diagram illustrating a procedure of correcting a layout according to example embodiments.

Referring to FIGS. 2 and 22, the machine learning module 220 may generate an ACI image 410 based on input channels corresponding to a layout image 400, and the correction module 240 may generate an error value based on a result of comparing the ACI image 410 and a target image 420. When the error value is not within an acceptable range, the correction module 240 may adjust the layout and convert the adjusted layout to an adjusted layout image, thereby forming a new layout image 400. The machine learning module 220 may generate an adjusted ACI image 410 based on the corresponding to the adjusted layout image 400. Such repetition may be referred to as an iteration.

The correction module 240 may compare the size x1/y1 of the pattern in the ACI image 410 and the size x2/y2 of the pattern in the target image 420 to generate an error value dx/dy as shown in an image 430. For example, during the zero-th iteration (e.g., a first iteration), the size x/y of the pattern in the layout image 400 may be 100/100, the size x1/y1 of the pattern in the ACI image 410 may be 120/122, and the size x2/y2 of the pattern in the target image 420 may be 110/110. The sizes of the pattern may be represented by an arbitrary unit A.U. In this example, the error value dx/dy by the zero-th iteration may be 10/12, and the correction module 240 may adjust the layout to perform the first iteration based on the adjusted layout.

For example, during the first iteration, the size x/y of the pattern in the adjusted layout image 400 may be 90/98, and the size x1/y1 of the pattern in the adjusted ACI image 410 may be 108/109. The error value dx/dy by the first iteration may be −2/−1, and the correction module 240 may adjust the layout and perform the second iteration based on the adjusted layout.

For example, during the second iteration, the size x/y of the pattern in the adjusted layout image 400 may be 92/89, and the size x1/y1 of the pattern in the adjusted ACI image 410 may be 110.2/110.3. The error value dx/dy by the second iteration may be 0.2/0.3, and the correction module 240 may adjust the layout to perform the N-th iteration based on the adjusted layout.

For example, during the N-th iteration, the size x/y of the pattern in the adjusted layout image 400 may be 92.2/89.4, and the size x1/y1 of the pattern in the adjusted ACI image 410 may be 110/110. The error value dx/dy by the N-th iteration may be 0/0 or approximately 0/0, and the correction module 240 may determine that the error value is within the acceptable range and stop adjusting the layout.

As such, the iterations may be repeated until the error value is within the acceptable range, and the semiconductor processes may be performed based on the finally adjusted layout.

Hereinafter, example embodiments of adding zoom-in images and zoom-out image to the input channels of the machine learning module with reference to FIGS. 23A through 24. The images illustrated in FIGS. 23A through 24 correspond to the combined image including the dimensional horizontal features of the patterns, the horizontal features indicating the effect of the neighboring patterns, and the vertical features indicating the effect of the lower structure as described with reference to FIG. 20.

Figure 23A:
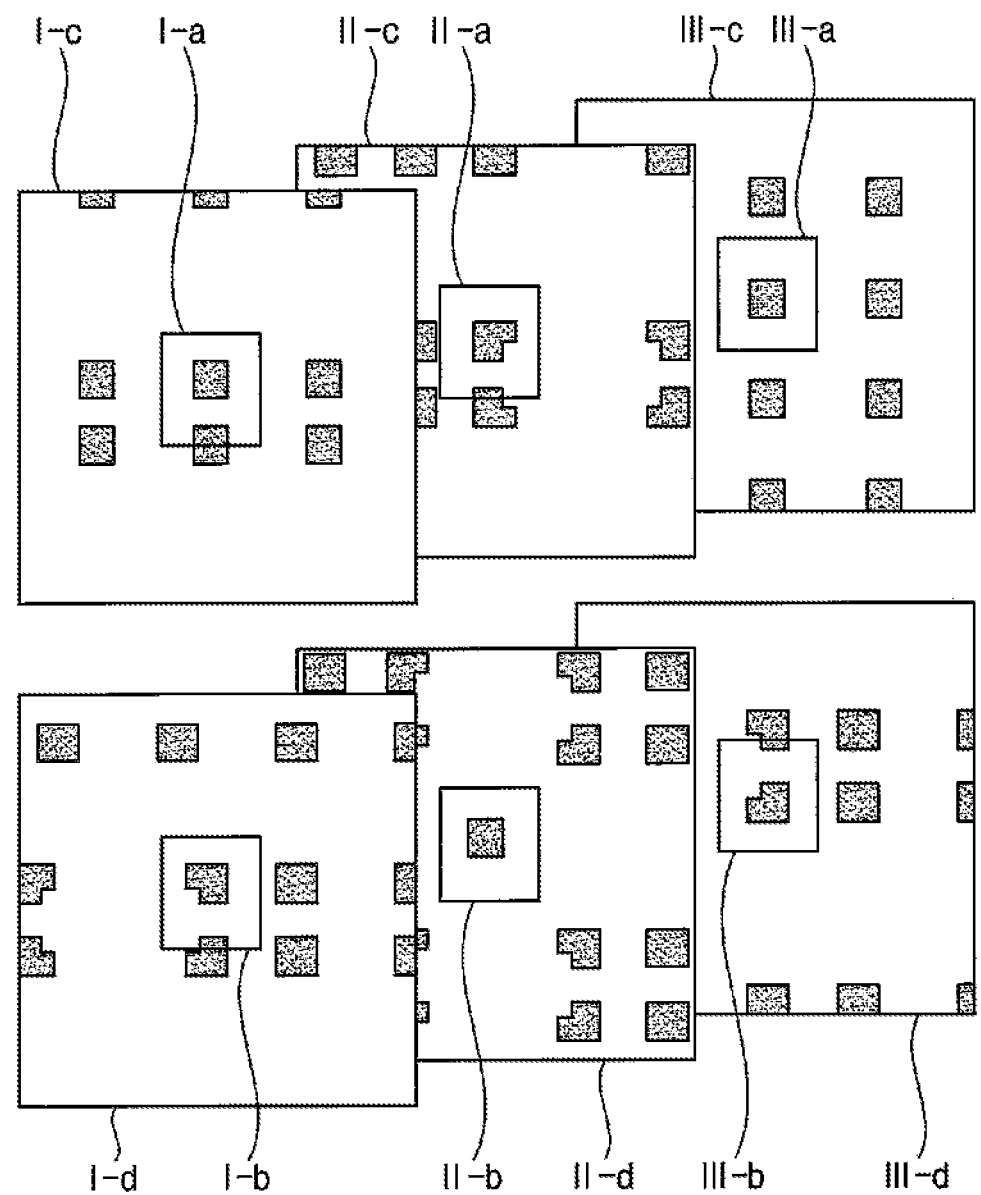
FIGS. 23A and 23B are diagrams illustrating input channels adjusted with multiple scaling factors in a method of correcting a layout for semiconductor processes according to example embodiments.
Figure 23B:
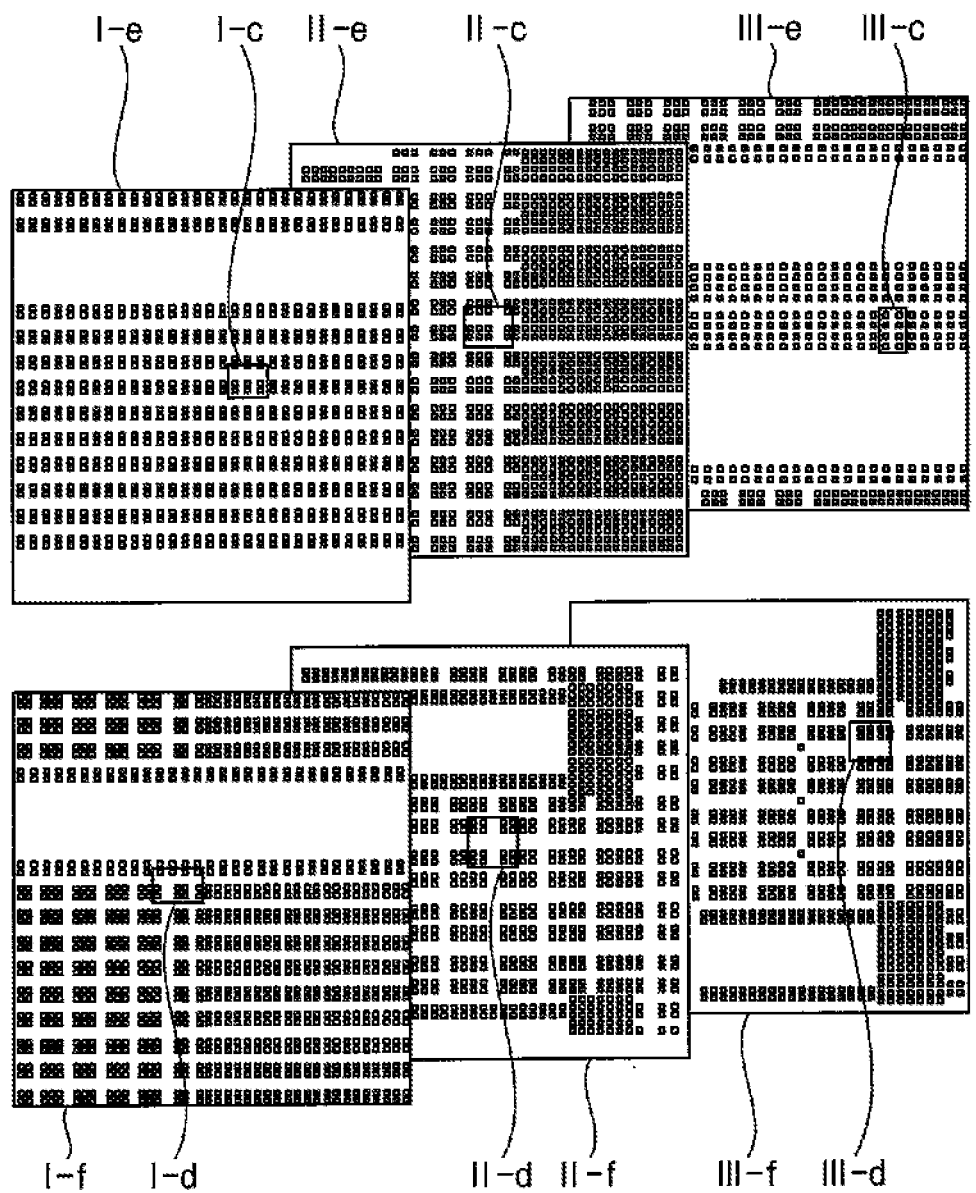

FIGS. 23A and 23B are diagrams illustrating input channels adjusted with multiple scaling factors in a method of correcting a layout for semiconductor processes according to example embodiments.

Referring to FIG. 23A, at least one processor of the processors 110 in FIG. 2 may provide zoom-in images I-c, I-d, II-c, II-d, III-c, and III-d of the combined images I-a, I-b, II-a, II-b, III-a, and III-b. The zoom-in images I-c, I-d, II-c, II-d, III-c, and III-d may be added to the input channels of the machine learning module 220.

Referring to FIG. 23B, at least one processor of the processors 110 in FIG. 2 may provide zoom-out images I-e, I-f, II-e, II-f, III-e, and III-f of the combined images I-c, I-d, II-c, II-d, III-c, and III-d. The zoom-out images I-e, I-f, II-e, II-f, III-e, and III-f may also be added to the input channels of the machine learning module 220.

Figure 24:
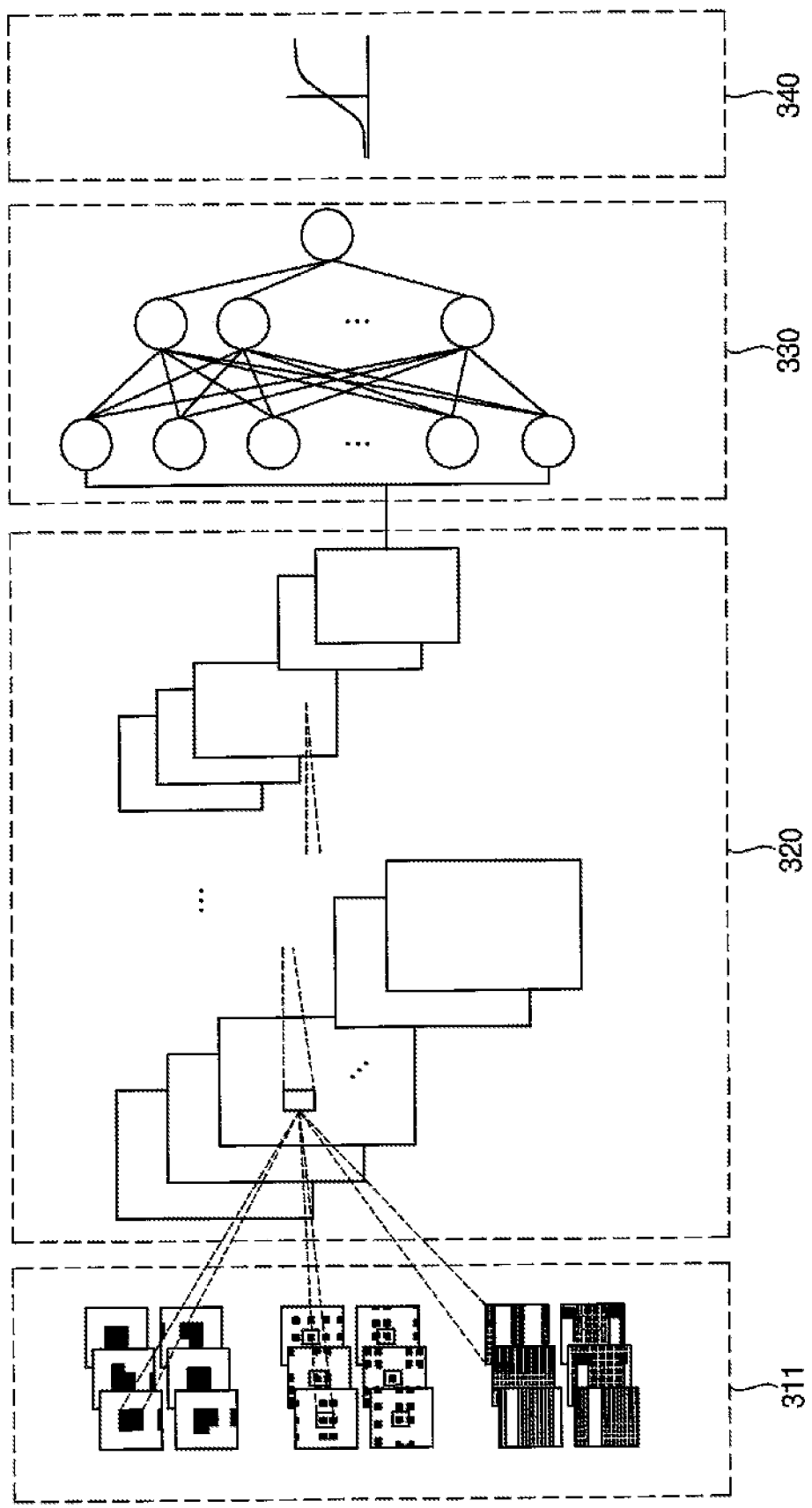
FIG. 24 is a diagram illustrating a machine learning module performing a method of correcting a layout for semiconductor processes according to example embodiments.

FIG. 24 is a diagram illustrating a machine learning module performing a method of correcting a layout for semiconductor processes according to example embodiments. The machine learning module of FIG. 24 is substantially the same as the machine learning module of FIG. 21 except the input channels, and repeated descriptions may be substantially omitted.

Referring to FIGS. 2 and 24, the machine learning module 220 may receive, as input channels 311, the combined images converted based on the horizontal features and the vertical features, the zoom-in images of the combined images and the zoom-out images of the combined images. By adding the zoom-in images and the zoom-out images to the input channels of the machine learning module 220, the effects of the patterns in the long range may be considered in the adjustment process.

As will be appreciated by one skilled in the art, example embodiments may be embodied as a system, method, computer program product, or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

The example embodiments may be applied to design and manufacturing process of a semiconductor device. For example, the example embodiments may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing embodiments are illustrative of the inventive concept, which is not necessarily limited to the illustrative embodiments. Although a few example embodiments have been described, those skilled in the art will readily appreciate that many modifications are possible in the example embodiments without materially departing from the present inventive concept.

What is claimed is:

1. A method of correcting a layout for semiconductor processes, comprising:
   receiving a layout, wherein the layout comprises schematic information for semiconductor processes to form process patterns of a semiconductor device, and further comprises a plurality of layout patterns,
   with respect to each layout pattern of the plurality of layout patterns included in the layout, determining vertical features indicating an effect of a lower structure on the process patterns, wherein the lower structure is a structure that is formed in the semiconductor device before the process patterns are formed, and wherein the vertical features include depth positions of the lower structure with respect to the layout pattern;

training a machine learning module based on a training layout and the vertical features of the training layout;

inferring an after-cleaning inspection (ACI) result using the machine learning model based on the vertical features; and correcting a design layout based on the ACI result, wherein the design layout comprises schematic information to form target process patterns.

2. The method of claim 1, wherein the vertical features include position information corresponding to a vertical position at which a composition of the lower structure is varied with respect to each of the layout patterns.

3. The method of claim 1, wherein the semiconductor processes include an etching process, and wherein a position information includes a vertical position of an etch-stopping layer corresponding to each of the layout patterns.

4. The method of claim 1, wherein the vertical features include group information corresponding to a composition forming the lower structure with respect to each of the layout patterns.

5. The method of claim 4, wherein the semiconductor processes include an etching process, and the group information includes a composition of an etch-stopping layer corresponding to each of the layout patterns.

6. The method of claim 1, further comprising:
with respect to each layout pattern of the of the plurality of layout patterns, determining horizontal features indicating an effect of a disposition of the layout patterns on the process patterns.

7. The method of claim 6, wherein training the machine learning module further comprises generating input channels for training of the machine learning module, by converting the training layout and the horizontal features and the vertical features of the training layout to data, and
wherein correcting the design layout includes generating input channels for inference of the trained machine learning module, by converting the design layout and the horizontal features and the vertical features of the design layout to data.

8. The method of claim 6, wherein the horizontal features include density information and distance information of neighboring layout patterns disposed near each of the layout patterns.

9. The method of claim 6, wherein the horizontal features further comprise electric field information on an electric field applied to each of the layout patterns during an etching process.

10. The method of claim 6, wherein the horizontal features include skew information relating to a skew occurring in each of the layout patterns during an etching operation, and wherein the skew information includes harmonics that correct angles of position vectors of neighboring layout patterns disposed near each of the layout patterns.

11. The method of claim 6, wherein the machine learning module performs a first inference based on linear regression with respect to the horizontal features and the vertical features, and wherein the machine learning module performs a second inference based on nonlinear regression with respect to a result of the first inference.

12. The method of claim 1, wherein training the machine learning module further comprises generating input channels for training of the machine learning module, by converting the training layout and the vertical features of the training layout to images and providing the images to the machine learning module, and
wherein correcting the design layout further comprises generating input channels for inference of the trained machine learning module, by converting the design layout and the vertical features of the design layout to images to provide to the trained machine learning module.

13. The method of claim 12, wherein the training layout is converted to a set of first images, the vertical features of the training layout are converted to a set of second images, and the set of first images and the set of second images are provided to the input channels for training of the machine learning module, and
wherein the design layout is converted to a set of third images, the vertical features of the design layout are converted to a set of fourth images, and the set of third images and the set of fourth images are provided to the input channels for inference of the machine learning module that are trained.

14. The method of claim 12, wherein the training layout and the vertical features of the training layout are converted to a set of first combined images, and the set of first combined images are provided to the input channels for training of the machine learning module, and
wherein the design layout and the vertical features of the design layout are converted to a set of second combined images, and the set of second combined images are provided to the input channels for inference of the trained machine learning module.

15. The method of claim 12, further comprising:
providing zoom-in images and zoom-out images of the sets of images to the input channels of the machine learning module.

16. The method of claim 12, wherein the sets of images are generated using a binary scheme, an area overlap scheme, or a level set scheme.

17. The method of claim 1, wherein the layout patterns included in the design layout correspond to photoresist patterns, and the design layout is corrected by performing a process proximity correction (PPC) using the machine learning module.

18. The method of claim 1, wherein the layout patterns included in the design layout correspond to photo-mask patterns, and the design layout is corrected by performing an optical proximity correction (OPC) using the machine learning module.

* * * * *